US012456693B2

(12) United States Patent
Kato

(10) Patent No.: US 12,456,693 B2
(45) Date of Patent: Oct. 28, 2025

(54) METHOD FOR DUAL WAVELENGTH OVERLAY MEASUREMENT WITH FOCUS AT A PHOTORESIST TOP SURFACE AND APPARATUS FOR USING SAME

(71) Applicant: SANDISK TECHNOLOGIES LLC, Addison, TX (US)

(72) Inventor: Katsuya Kato, Yokkaichi (JP)

(73) Assignee: Sandisk Technologies, Inc., Milpitas, CA (US)

(*) Notice: Subject to any disclaimer, the term of this patent is extended or adjusted under 35 U.S.C. 154(b) by 626 days.

(21) Appl. No.: 17/930,156

(22) Filed: Sep. 7, 2022

(65) Prior Publication Data

US 2024/0079341 A1 Mar. 7, 2024

(51) Int. Cl.
*H01L 23/544* (2006.01)
*G03F 7/00* (2006.01)

(52) U.S. Cl.
CPC .......... *H01L 23/544* (2013.01); *G03F 7/0002* (2013.01); *G03F 7/707* (2013.01); *G03F 7/70716* (2013.01)

(58) Field of Classification Search
CPC ........... H01L 23/544; H01L 2223/5446; H01L 2223/54426; G03F 7/0002; G03F 7/707; G03F 7/70716; G03F 7/70633
See application file for complete search history.

(56) References Cited

U.S. PATENT DOCUMENTS

| | | | |
|---|---|---|---|
| 5,124,927 A * | 6/1992 | Hopewell | G03F 7/706 430/311 |
| 5,783,342 A * | 7/1998 | Yamashita | G03F 7/38 430/311 |
| 9,985,046 B2 | 5/2018 | Lu et al. | |
| 10,381,322 B1 | 8/2019 | Azuna et al. | |
| 11,355,437 B2 | 6/2022 | Cui et al. | |
| 11,972,960 B2 * | 4/2024 | Lee | H01L 21/67242 |
| 12,105,433 B2 * | 10/2024 | Feler | G03F 7/70683 |
| 12,211,724 B2 * | 1/2025 | Ohi | G02B 27/34 |
| 2002/0098426 A1 | 7/2002 | Sreenivasan et al. | |
| 2002/0115002 A1 | 8/2002 | Bailey et al. | |
| 2002/0150398 A1 | 10/2002 | Choi et al. | |
| 2004/0053146 A1 | 3/2004 | Sreenivasan et al. | |
| 2004/0086793 A1 | 5/2004 | Sreenivasan et al. | |
| 2012/0154773 A1 | 6/2012 | Beyer | |
| 2015/0371908 A1 | 12/2015 | Bencher et al. | |
| 2017/0358594 A1 | 12/2017 | Lu et al. | |

(Continued)

OTHER PUBLICATIONS

U.S. Appl. No. 17/510,833, filed Oct. 26, 2021, SanDisk Technologies LLC.

(Continued)

*Primary Examiner* — Hung V Nguyen
(74) *Attorney, Agent, or Firm* — THE MARBURY LAW GROUP PLLC

(57) ABSTRACT

An array of alignment marks can be formed in a substrate, and at least one material portion can be deposited and patterned. A photoresist material layer can be deposited and patterned to provide a kerf-region photoresist material portion. The overlay between the kerf-region photoresist material portion and a proximal alignment mark is measured employing a ultraviolet radiation that is focused at a focal plane located at or near a top surface of the kerf-region photoresist material portion.

18 Claims, 30 Drawing Sheets

(56) References Cited

U.S. PATENT DOCUMENTS

2018/0011409 A1    1/2018   Lalovic et al.
2021/0200079 A1    7/2021   Luo et al.
2022/0115396 A1    4/2022   Takahata

OTHER PUBLICATIONS

U.S. Appl. No. 17/662,758, filed May 10, 2022, SanDisk Technologies LLC.

* cited by examiner

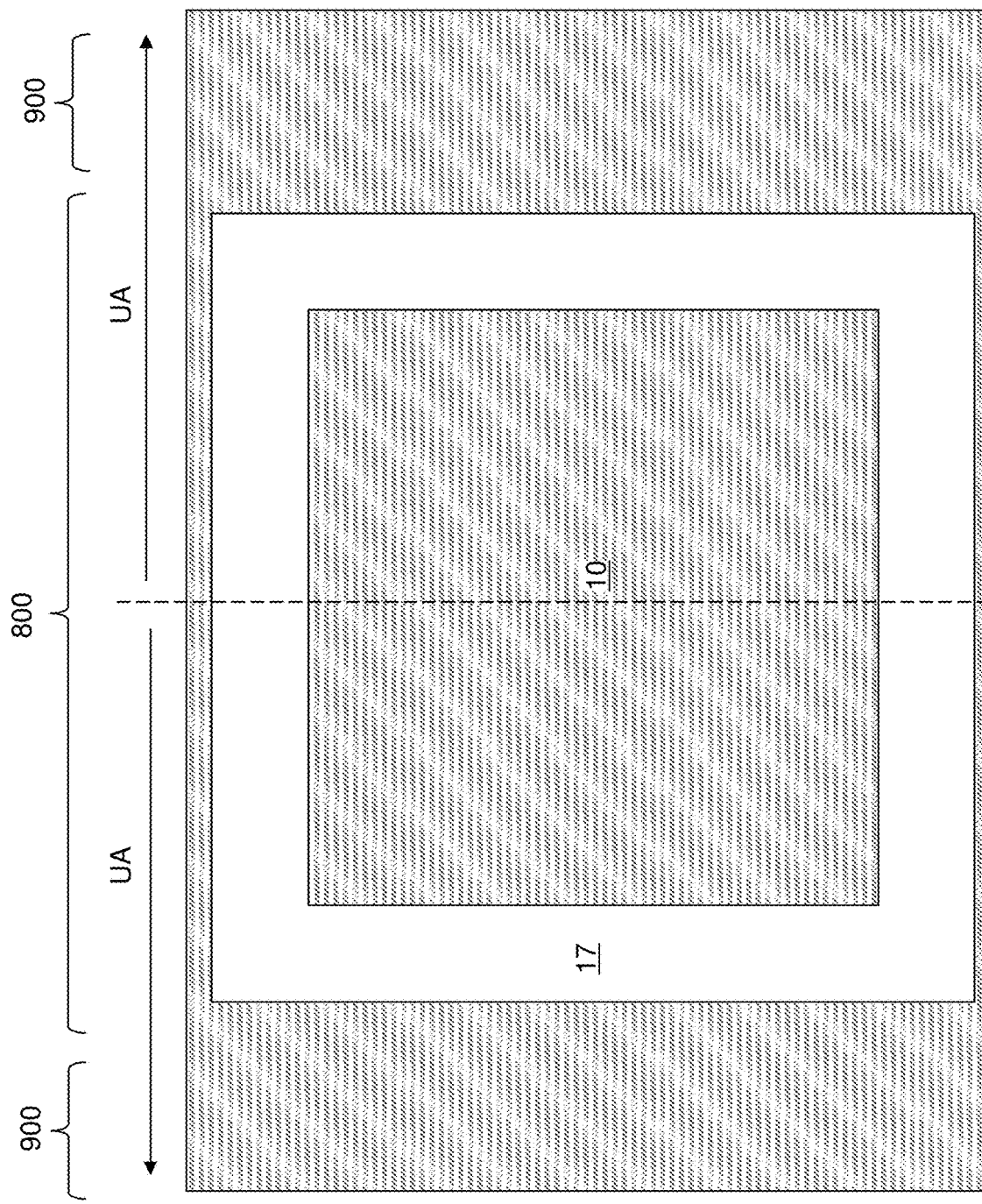

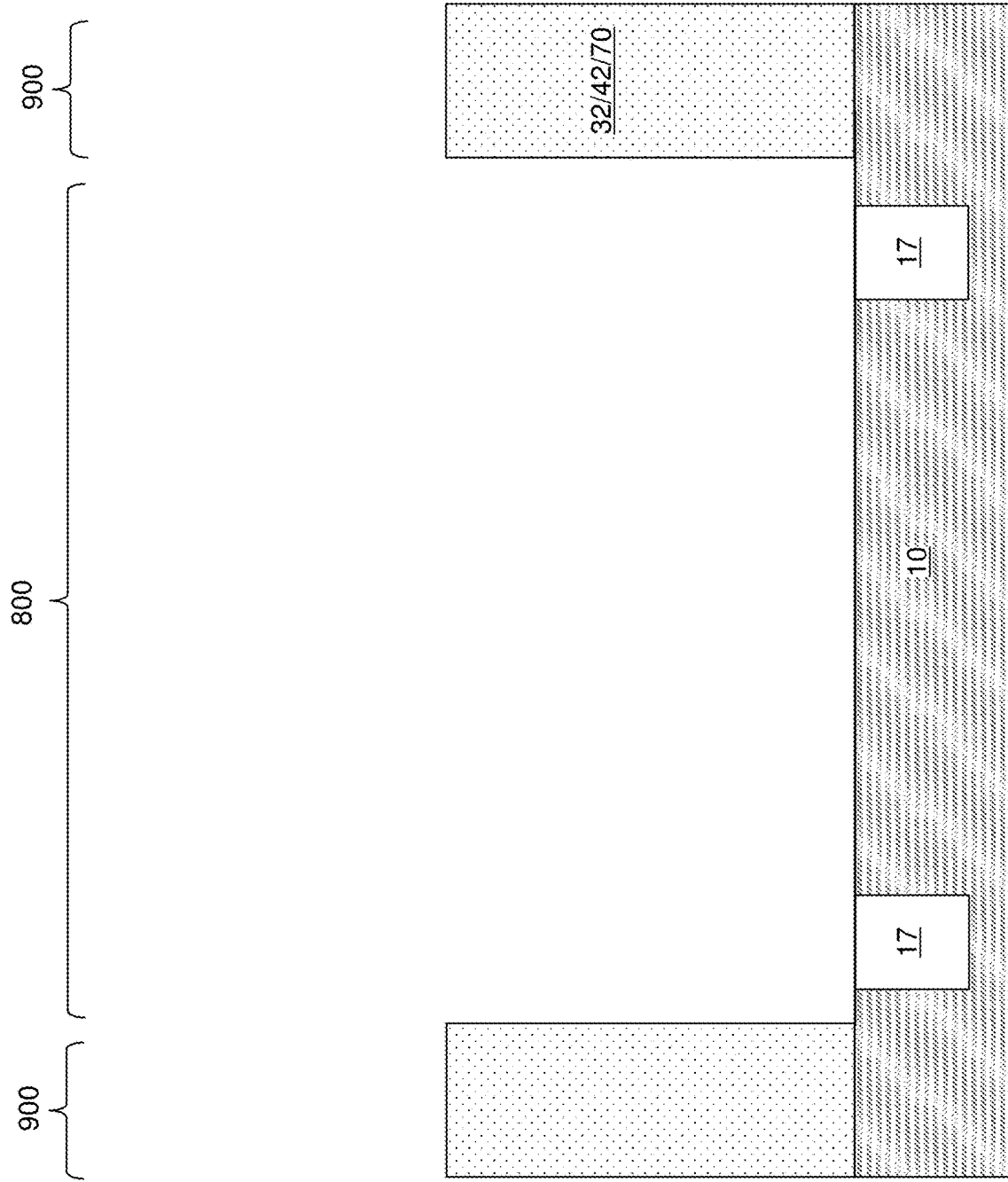

METHOD FOR DUAL WAVELENGTH OVERLAY MEASUREMENT WITH FOCUS AT A PHOTORESIST TOP SURFACE AND APPARATUS FOR USING SAME

FIELD

The present disclosure relates generally to the field of semiconductor manufacturing, and particularly to an overlay measurement method employing a focus at a photoresist top surface and an apparatus for using the same.

BACKGROUND

A photoresist material may be patterned with non-vertical sidewalls if the top surface of the photoresist material is not planar. The present disclosure enables an overlay measurement employing a top surface of a photoresist material portion instead of a bottom surface of the photoresist material portion. The overlay measurement of the present disclosure may be advantageously employed to provide an accurate estimate of the overlay between photoresist material portions and underlying structures in die regions.

SUMMARY

According to an aspect of the present disclosure, a method comprises forming an alignment mark in a kerf region, forming at least one material portion over the alignment mark, patterning the at least one material portion to expose the alignment mark located in the kerf region, forming a photoresist material layer over the patterned portions of the at least one material portion located in die regions and over the alignment mark located in the kerf region, lithographically patterning the photoresist material layer into die-region photoresist material portions that are formed within die regions and kerf-region photoresist material portion that is formed within the kerf region, and measuring an overlay between the kerf-region photoresist material portion and the alignment mark using radiation having a peak wavelength that is less than 380 nm and that is focused at a focal plane located a height that is vertically raised above a horizontal plane including a top surface of the alignment mark by a vertical distance that is in a range from 50% to 100% of a maximum thickness the kerf-region photoresist material portion.

According to another aspect of the present disclosure, an overlay measurement apparatus comprises a chuck configured to mount a semiconductor wafer thereupon, an ultraviolet radiation source configured to emit ultraviolet radiation having a peak wavelength of 380 nm or less, a visible light source configurated to emit visible light, a camera configured to sequentially generate images of an area with changes in a location of a focal plane along a vertical direction that is perpendicular to a top surface of the chuck and a controller configured to analyze the images generated by the camera based on the ultraviolet radiation reflected from the semiconductor wafer, and measure an overlay offset of an image of the top surface of a photoresist material portion relative to an alignment mark located within the semiconductor wafer in proximity to the photoresist material portion.

BRIEF DESCRIPTION OF THE DRAWINGS

FIG. 1C is a magnified top-down view of the region of the semiconductor wafer that is illustrated in FIG. 1B.

FIG. 3B is a vertical cross-sectional view of a first region of the semiconductor wafer along the first vertical plane B-B' of FIG. 3A.

DETAILED DESCRIPTION

Figure 1A:
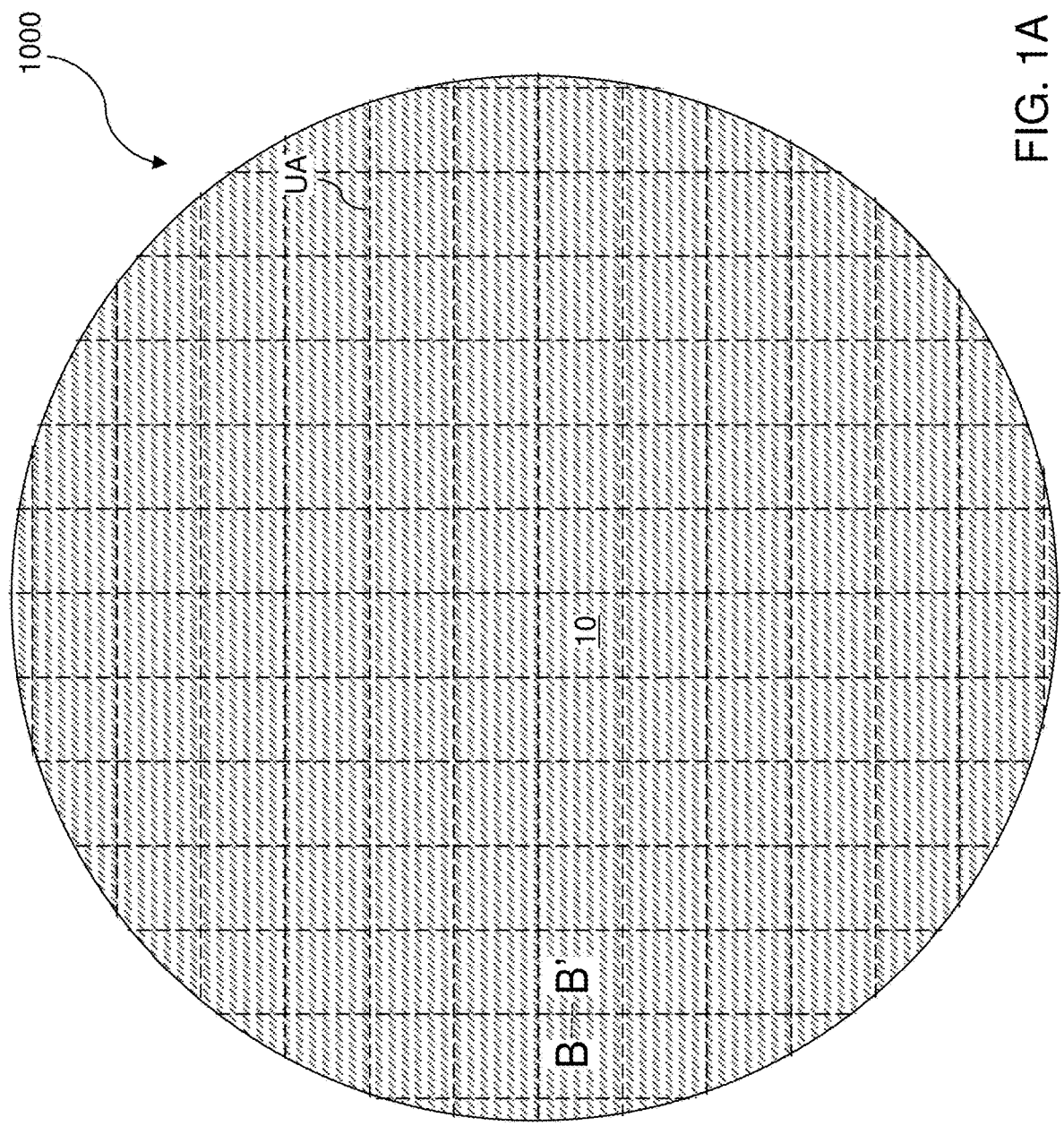
FIG. 1A is a top-down view of a semiconductor wafer including a semiconductor material layer according to an embodiment of the present disclosure.

As discussed above, the present disclosure is directed to a dual wavelength overlay measurement method employing a focus at a photoresist top surface used during fabrication of semiconductor devices, such as three-dimensional memory devices, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
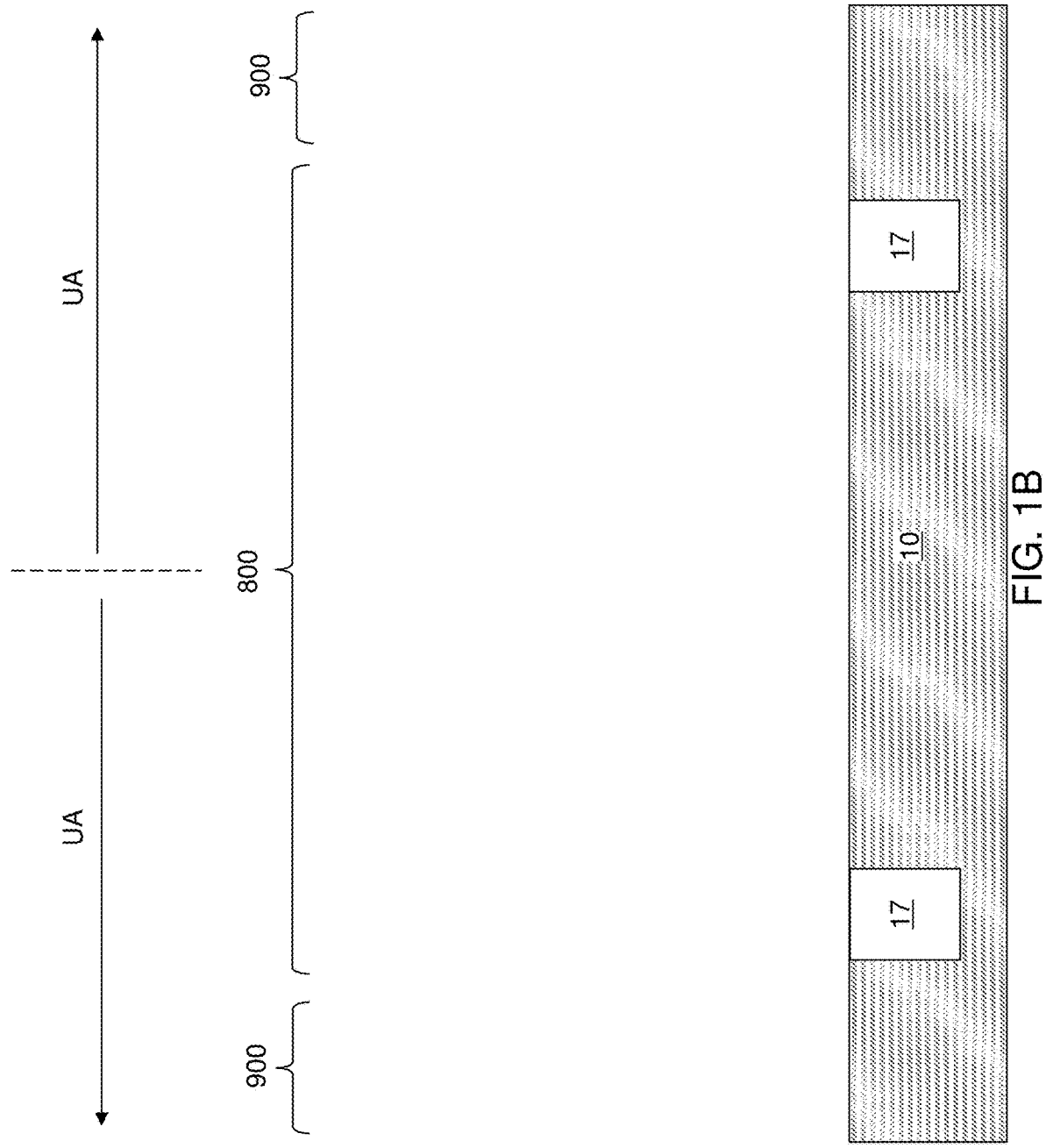
FIG. 1B is a vertical cross-sectional view of a region of the semiconductor wafer along the vertical plane B-B' of FIG. 1A.

Referring to FIGS. 1A-1C, a semiconductor wafer 1000 according to an embodiment of the present disclosure is illustrated, which can be employed to fabricate an array of semiconductor dies thereupon. The semiconductor wafer 1000 may comprise a semiconductor material layer 10. Generally, the semiconductor material layer 10 can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. In one embodiment, a commercially available single crystalline silicon wafer may be employed as the semiconductor wafer 1000, and the semiconductor material layer 10 may comprise a doped well in the top portion of the wafer 1000 or an epitaxial silicon layer located over a top surface of the wafer 1000.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material"

refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The total area of the semiconductor wafer 1000 may be divided into a two-dimensional array of unit areas UA, which may be a rectangular array having a first periodicity along a first horizontal direction and having a second periodicity along a second horizontal direction. Each unit area UA may include a die region 900 having an area that is less than the entire area of the unit area UA. In one embodiment, the die region 900 may be a rectangular area located inside the unit area UA and laterally offset inward from the periphery of the unit area UA at least by a minimum lateral offset distance. The minimum lateral offset distance may be in a range from 10 microns to 600 microns, such as from 20 microns to 300 microns, although lesser and greater minimum lateral offset distances may also be employed. Each segment of the semiconductor wafer 1000 that is located at the periphery of the semiconductor wafer 1000 and having a lesser area than a unit area UA is herein referred to as a partial die region.

The areas between neighboring pairs of die regions 900 are referred to as kerf regions 800. The die regions 900 may be subsequently separated into semiconductor dies by dicing (e.g., sawing) the wafer 1000 through the kerf regions 100. The kerf regions 800 may include various intermediate structures, such as alignment marks 17 and test devices (not shown) that are not incorporated into the semiconductor dies to be subsequently formed. FIGS. 1B and 1C illustrate an alignment mark 17 having a shape of a rectangular frame. However, other mark shapes may be used. The alignment marks 17 may be subsequently employed as an alignment reference structure to align a photolithographic pattern to be printed on a photoresist layer in a photolithographic exposure process (i.e., as a reference structure for aligning a subsequent photolithographic pattern). Further, the alignment marks 17 may be employed as an overlay measurement reference structure to measure the overlay offset of the photolithographic pattern in the photoresist layer with respective to underlying patterns (i.e., as a reference structure for measuring the overlay error of a photolithographic pattern with respect to the underlying patterns).

In one embodiment, an array of alignment marks 17 can be formed in an upper portion of the semiconductor material layer 10 (which is part of a substrate) outside areas of the die regions 900 and within areas of the kerf regions 800. In one embodiment, the alignment marks 17 may be formed by etching trenches in the kerf regions 800, and by filling the trenches with a dielectric fill material, such as silicon oxide. The two-dimensional periodicity of the alignment marks 17 may be the same as the two-dimensional periodicity of the unit areas UA, which is the same as the two-dimensional periodicity of the semiconductor dies to be subsequently formed. The depth of the alignment marks 17 may be in a range from 100 nm to 400 nm. The lateral distance between an inner periphery and a most proximal portion of the outer periphery of the top surface of each alignment mark 17 may be in a range from 20 nm to 200 nm, although lesser and greater lateral distance may also be employed. The lateral extent of each alignment mark 17, for example, between parallel pairs of line segments of the outer periphery of the alignment mark 17, may be in a range from 300 nm to 3 microns, although lesser and greater lateral extents may also be employed.

Figure 2:
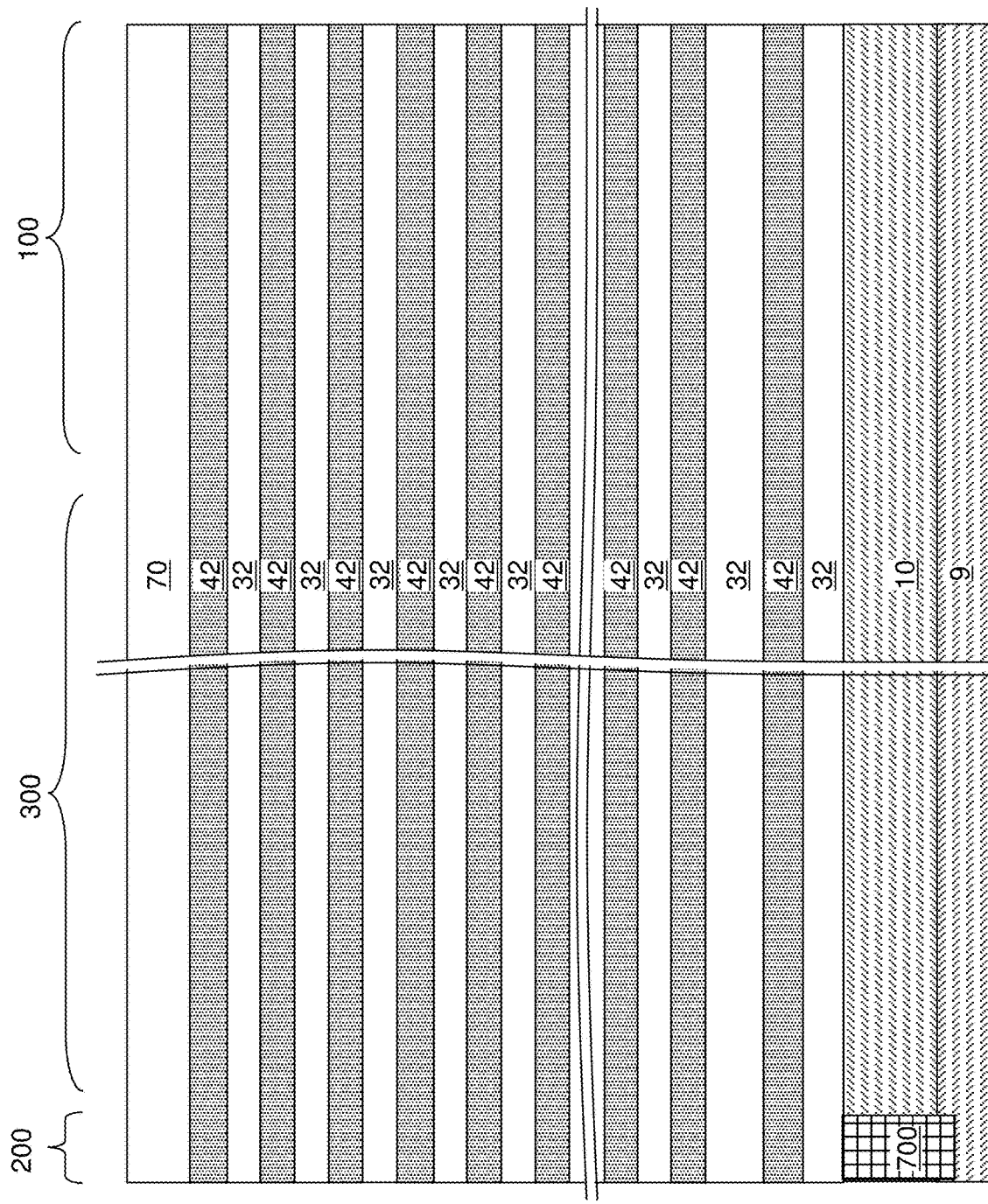
FIG. 2 is a schematic vertical cross-sectional view of an exemplary structure located within a die region after formation of optional peripheral devices, an alternating stack of insulating layers and sacrificial material layers, stepped surfaces, and a retro-stepped dielectric material portion according to an embodiment of the present disclosure.

Referring to FIG. 2, a device structure may be formed within each unit area UA on the semiconductor wafer 1000 illustrated in FIG. 1A. In an illustrative example, at least one semiconductor device 700 for a peripheral circuitry can be formed on a portion of the semiconductor material layer 10. The at least one semiconductor device 700 can include, for example, field effect transistors. In a non-limiting illustrative example, the least one semiconductor device 700 for the peripheral circuitry can contain a driver circuit for memory devices to be subsequently formed, which can include at least one NAND device. The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Each die region 900 (within a respective unit are of the semiconductor wafer 1000) includes at least one memory array region 100, at least one peripheral device region 200, and at least one contact region 300.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

A stack of an alternating plurality of first material layers (which can be insulating layers 32) and second material layers (which can be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. The sacrificial material layers 42 are replaced with electrically conductive layers that function as gate electrodes. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While an embodiment in which the spacer material layers are sacrificial material layers 42 that are subsequently replaced with electrically conductive layers is described above, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Generally, at least one material portion can be formed over the array of alignment marks 17 in the kerf regions 800. In one embodiment, the combination of the alternating stacks (32, 42) and the insulating layers 70 may cover all areas of the semiconductor wafer 1000. Thus, all die regions 900 and all kerf regions 800 on the semiconductor wafer 1000 may be covered by the combination of the alternating stacks (32, 42) and the insulating layers 70.

Figure 3A:
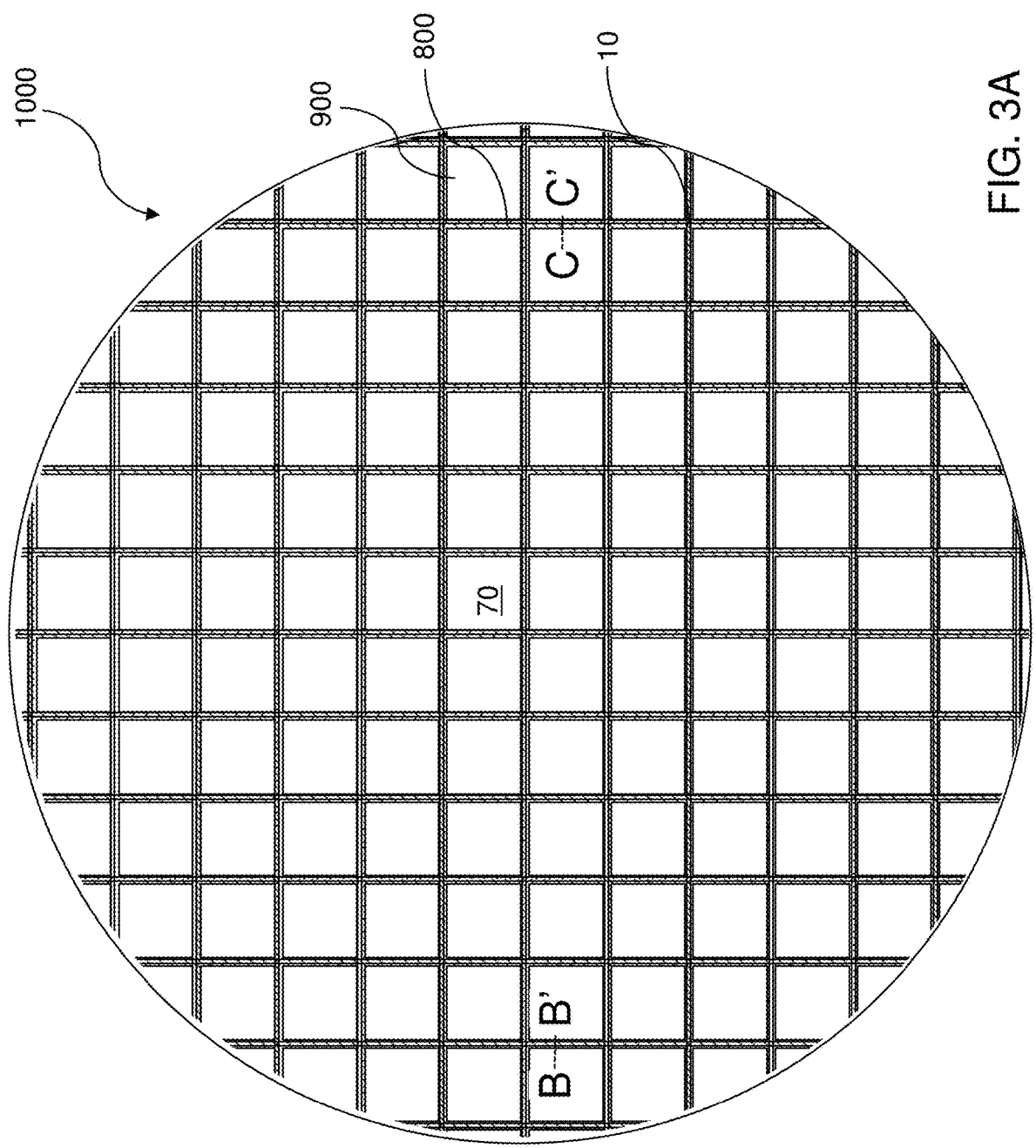
FIG. 3A is a top-down view of the semiconductor wafer after removal of material portions overlying the semiconductor wafer from kerf regions according to an embodiment of the present disclosure.
Figure 3C:
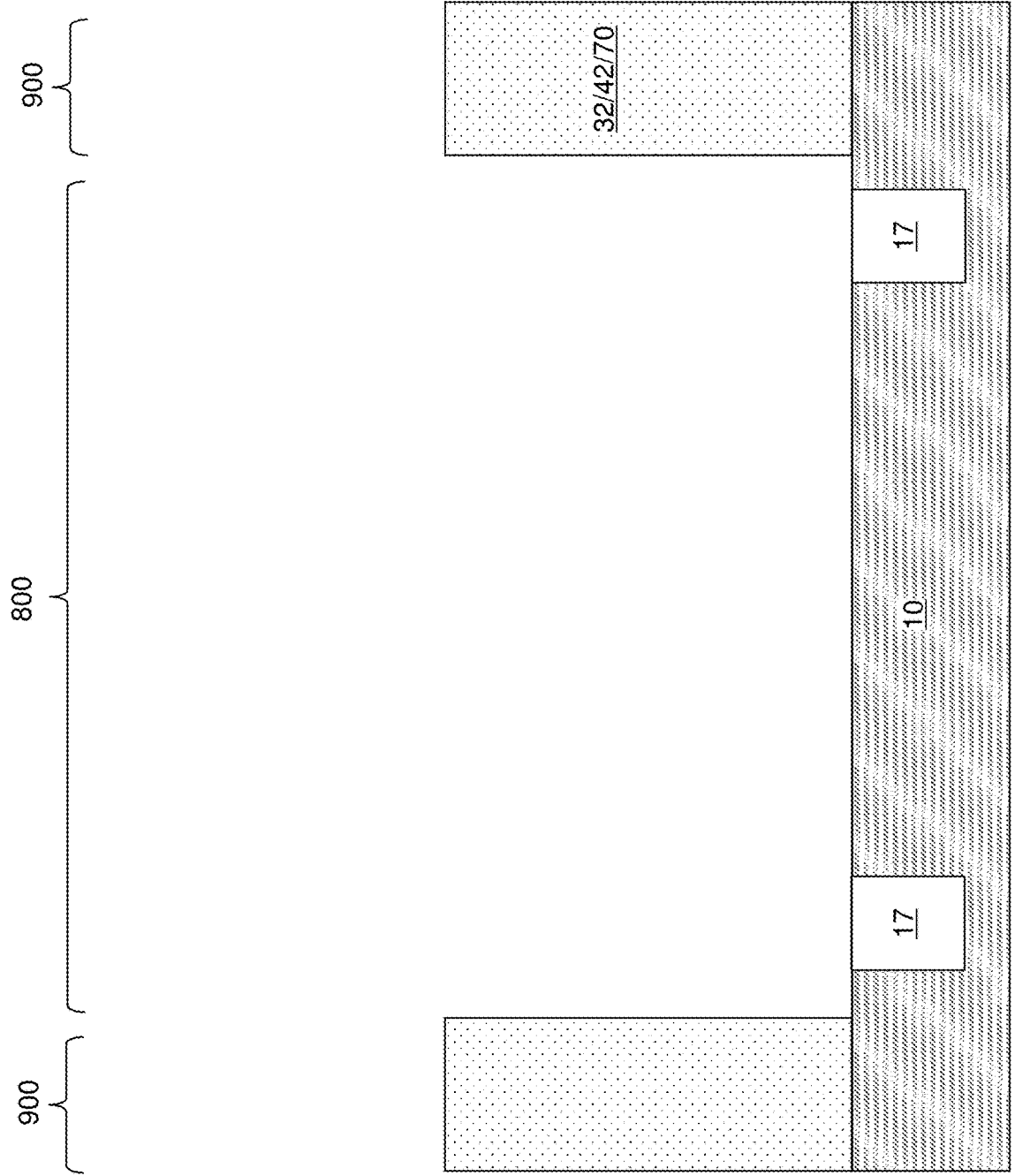
FIG. 3C is a vertical cross-sectional view of a second region of the semiconductor wafer along the second vertical plane C-C' of FIG. 3A.

Referring to FIGS. 3A-3C, a photoresist layer (not shown) may be applied over the combination of the alternating stacks (32, 42) and the insulating layer 70 and can be lithographically patterned to form patterned photoresist material portions that cover the die regions 900 without covering the kerf regions 800. Thus, each die region 900 can be covered by a respective patterned photoresist material portion, and the kerf regions 800 are not covered by any photoresist material portion. The alignment marks 17 are located in the kerf regions 800, and as such, not covered by the photoresist material portions. Generally, at least one material portion can be formed over the alignment marks 17 in the kerf regions 800, and the photoresist layer can be patterned such that the at least one material portion is not covered by the photoresist layer within the kerf regions 800.

An etch process can be performed to remove portions of the at least one material portion (such as portions of the alternating stack (32, 42) and insulating layer 70) that are located in the kerf regions 800, while material portions in the die regions 900 are protected from the etch process by the photoresist material portions. The etch process may comprise an anisotropic etch process or an isotropic etch process. A top surface of each alignment mark 17 may be physically exposed after the etch process. Each die region 900 includes a respective patterned structure overlying the semiconductor material layer 10, which are subsequently employed to provide semiconductor devices within the respective die region 900. Generally, the at least one material portion overlying the semiconductor material layer 10 can be patterned such that each patterned portion of the at least one material portion is formed entirely within an area of a respective one of the die regions 900, and the array of alignment marks 17 is physically exposed within the areas of the kerf regions 800.

Figure 4A:
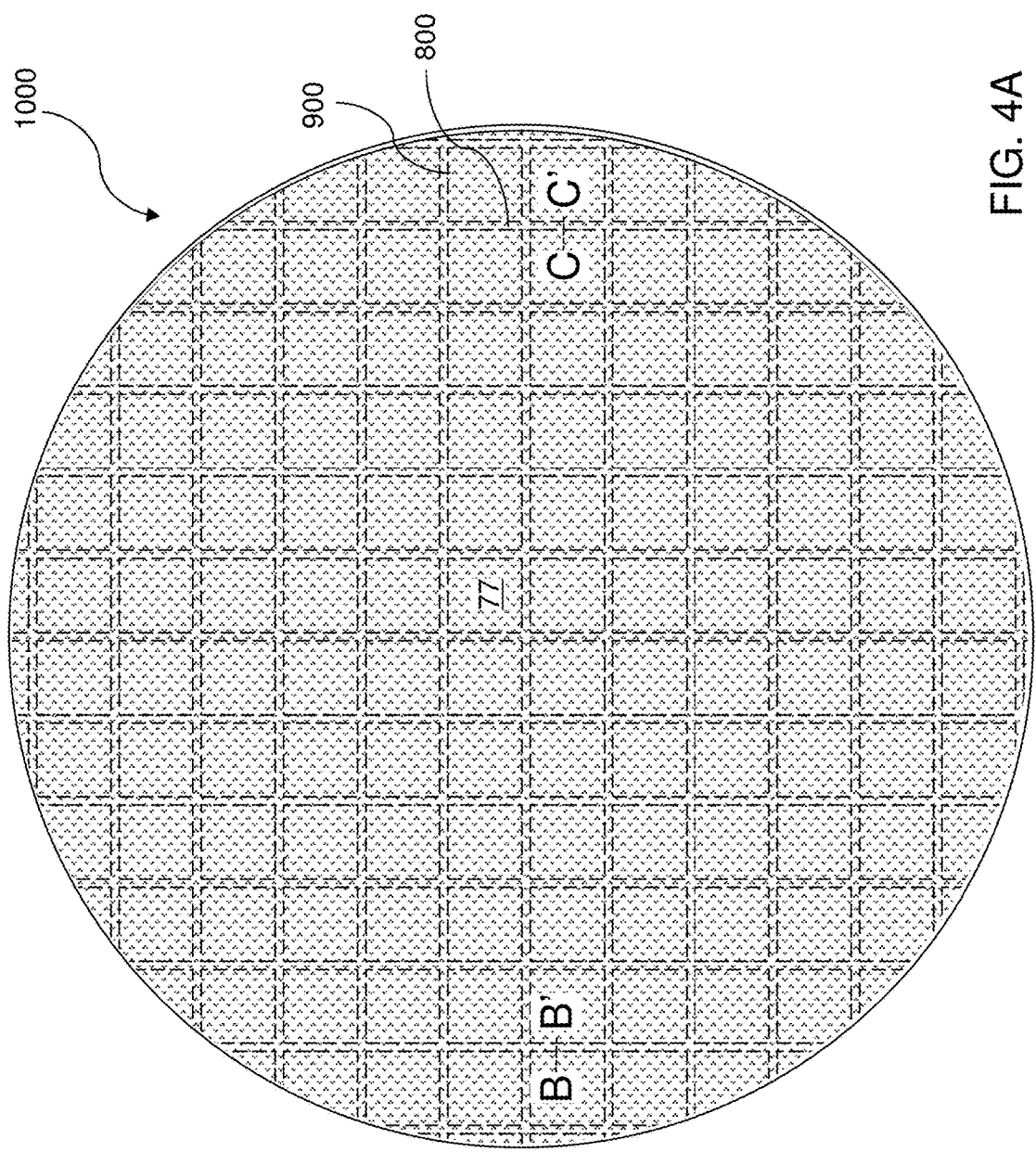
FIG. 4A is a top-down view of the semiconductor wafer after application of a photoresist layer according to an embodiment of the present disclosure.
Figure 4B:
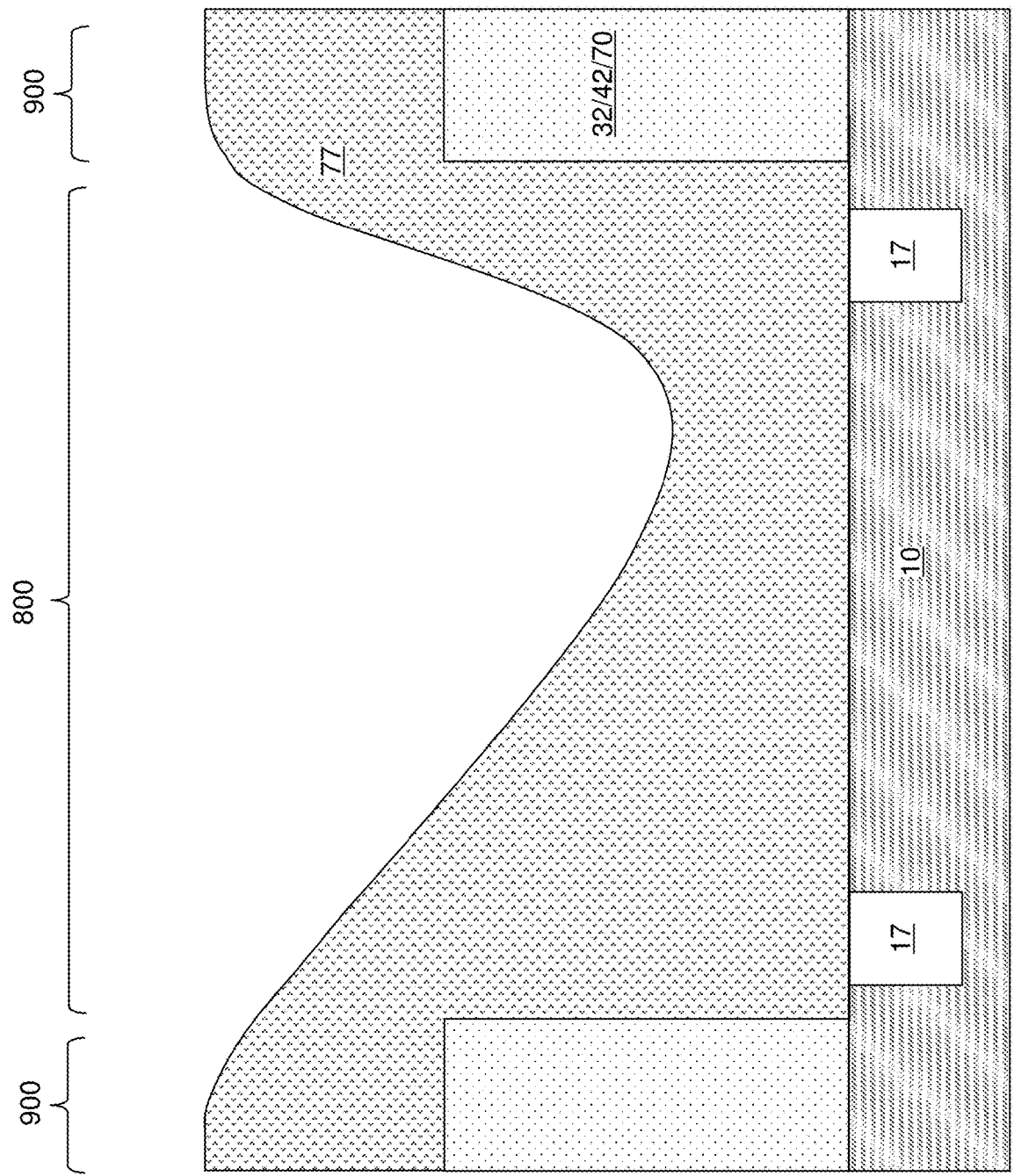
FIG. 4B is a vertical cross-sectional view of a first region of the semiconductor wafer along the first vertical plane B-B' of FIG. 4A.
Figure 4C:
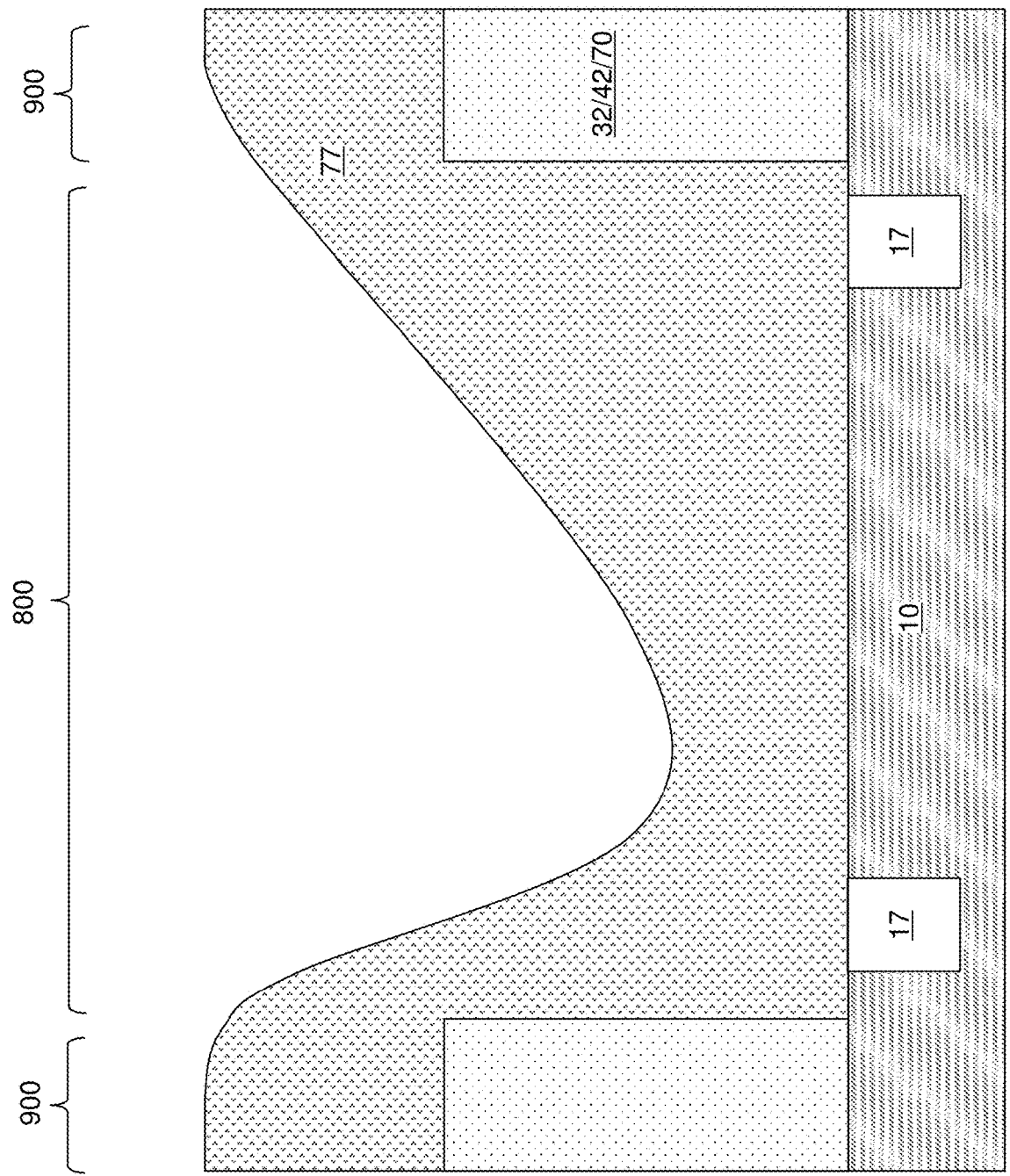
FIG. 4C is a vertical cross-sectional view of a second region of the semiconductor wafer along the second vertical plane C-C' of FIG. 4A.

Referring to FIGS. 4A-4C, a photoresist material layer 77 can be formed over the two-dimensional array of die regions 900 and over the kerf regions 80. The photoresist material layer 77 may be formed by a self-planarizing deposition method such as spin-coating. Generally, the photoresist material layer 77 has a finite viscosity. Therefore, the top surface of the photoresist material layer 77 is formed with a contoured profile that generally follows the underlying topography of the patterned structures in the die regions 900 and the gaps that are present in the kerf regions 800. Further, due to the asymmetric nature of the centrifugal force applied to the material of the photoresist material layer 77 during the spin-coating process along the radial direction, the vertical cross-sectional profile of the top surface of the photoresist material layer 77 is not symmetric along the radial direction in the kerf regions 800. FIG. 4B illustrates a region of the exemplary structure located at the left side of the semiconductor wafer 1000, and FIG. 4C illustrates a region of the exemplary structure located at the right side of the semiconductor wafer 1000. In one embodiment, a contoured top surface segment of the photoresist material layer 77 in a kerf region 800 may have a greater slope toward the center of the semiconductor wafer 1000 than toward the periphery of the semiconductor wafer 1000.

Generally, the photoresist material layer 77 can be formed over the patterned portions of the at least one material portion and over the array of alignment marks 17. In one embodiment, the average thickness of the photoresist material layer 77 may be less than the total height of the at least one material portion. In an illustrative example, the at least one material portion, such as the alternating stack of insulating layers 32 and sacrificial material layers 42, may have a thickness in a range from 4 microns to 15 microns, such as from 8 microns to 12 microns, and the photoresist material layer 77 may have an average thickness less than 4 microns, such as from 600 nm to 2 microns. In one embodiment, a portion of the photoresist material layer 77 located within the areas of the kerf regions 800 has a top surface segment that is located below a horizontal plane including a topmost horizontal surface of the at least one material portion.

Figure 5A:
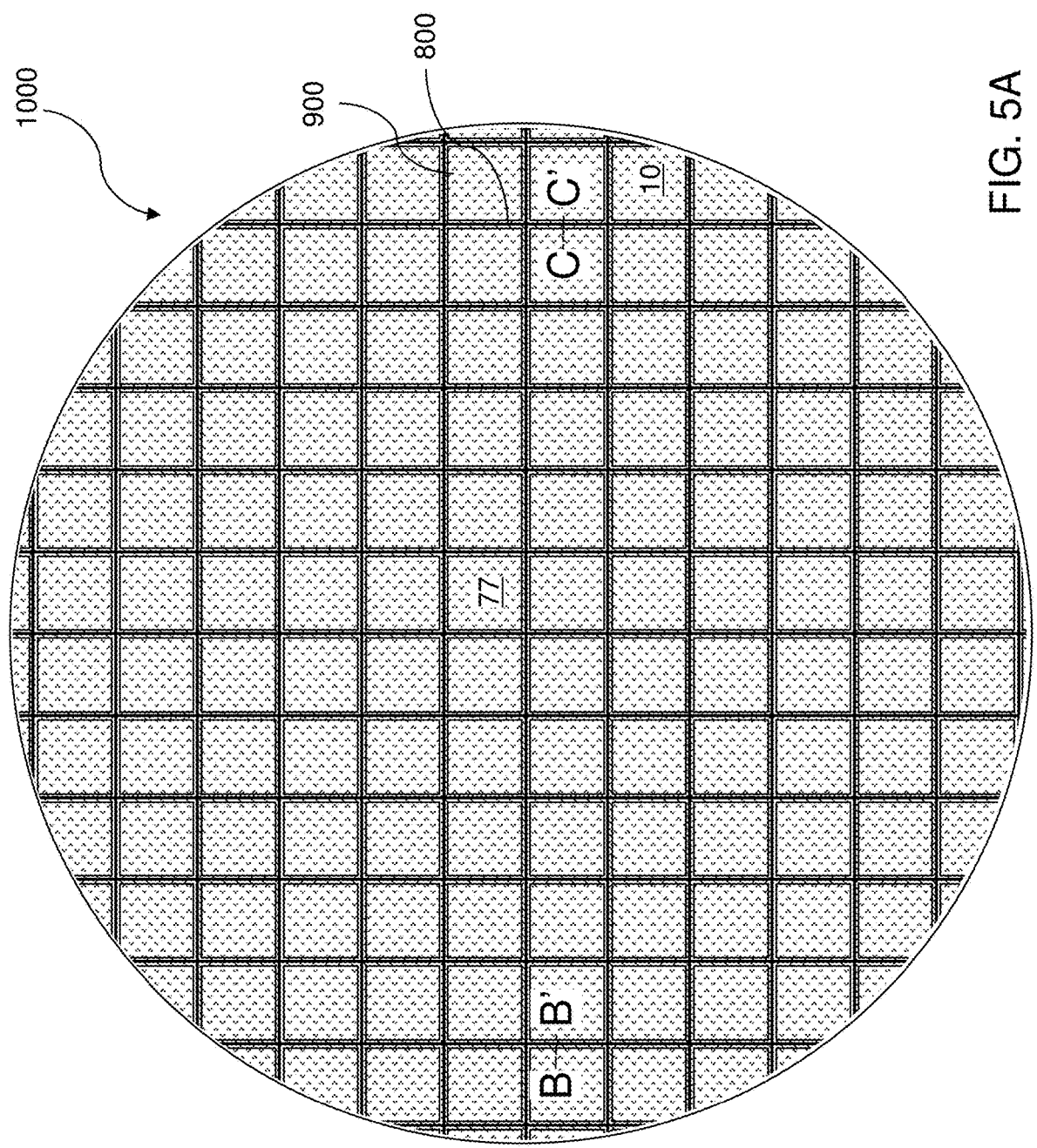
FIG. 5A is a top-down view of the semiconductor wafer after lithographic patterning of the photoresist layer according to an embodiment of the present disclosure.
Figure 5B:
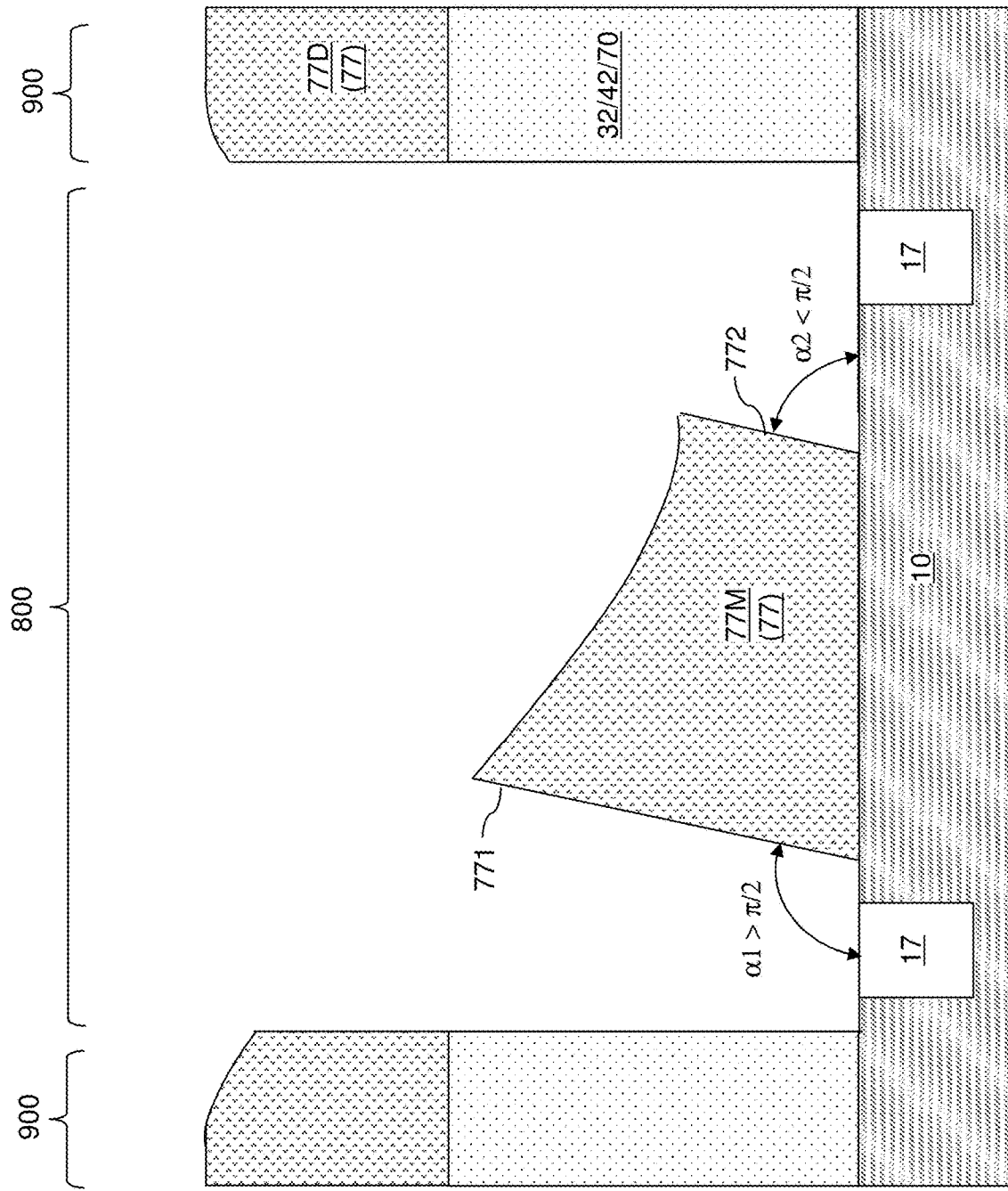
FIG. 5B is a vertical cross-sectional view of a first region of the semiconductor wafer along the first vertical plane B-B' of FIG. 5A.
Figure 5C:
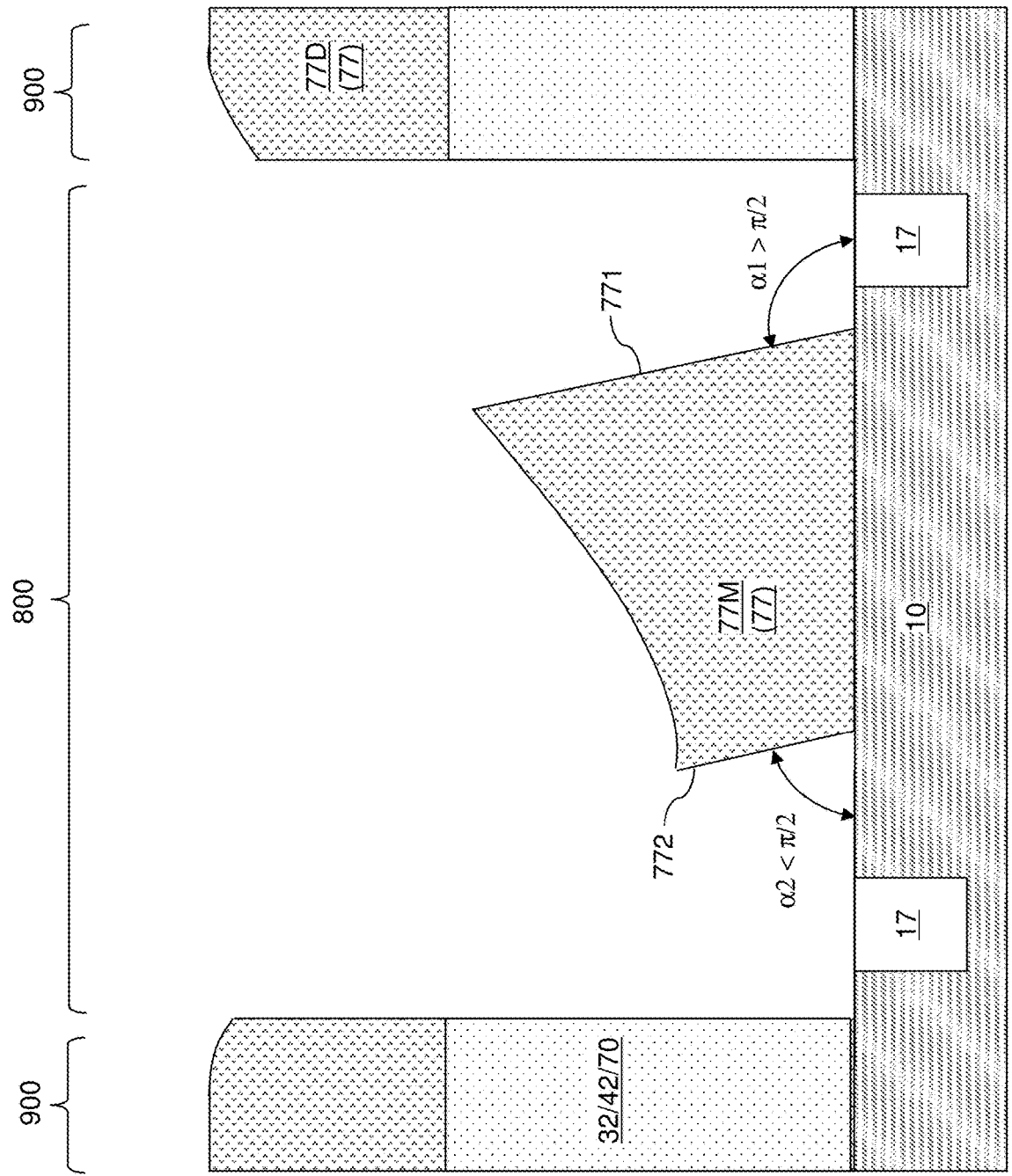
FIG. 5C is a vertical cross-sectional view of a second region of the semiconductor wafer along the second vertical plane C-C' of FIG. 5A.

Referring to FIGS. 5A-5C, the photoresist material layer 77 may be lithographically patterned to into various photoresist material portions (77D, 77M). The various photoresist material portions (77D, 77M) may comprise die-region photoresist material portions 77D that are formed within a respective die region 900 and including a pattern of openings therein, and kerf-region photoresist material portions 77M that are formed within the kerf regions 77M. The kerf-region photoresist material portions 77 may be formed in proximity to and/or within a respective one of the alignment marks 17.

In one embodiment, one, a plurality and/or each of the kerf-region photoresist material portions 77M may have a contoured top surface with a height variation that is at least 5% of an average height of the contoured top surface (as measured from the horizontal plane including the top surface of the semiconductor material layer 10). In one embodiment, one, a plurality and/or each of the kerf-region photoresist material portions 77M is formed with a first tapered sidewall 771 and a second tapered sidewall 772 located on opposite sides of a respective kerf-region photoresist material portion 77M and having a same tilt direction in a vertical cross-sectional view as illustrated in FIG. 5B and in FIG. 5C. In one embodiment, a first angle $\alpha 1$ between a horizontal plane including a top surface of the substrate (which includes the top surface of the semiconductor material layer 10) and the first tapered sidewall 771 is an obtuse angle, and a second angle $\alpha 2$ between the horizontal plane and the second tapered sidewall 772 is an acute angle. In one embodiment, the first angle $\alpha 1$ may be in a range from 90.5 degrees to 105 degrees, and the second angle $\alpha 2$ may be in a range from 75 degrees to 89.5 degrees. The sum of the first angle $\alpha 1$ and the second angle $\alpha 2$ may be the same as or about the same as 180 degrees.

In one embodiment, one, a plurality or each of the proximal alignment marks 17 may comprise two portions that are laterally spaced apart in the vertical cross-sectional view, and an entirety of a respective one of the kerf-region photoresist material portions 77M may be formed between the two portions of the proximal alignment mark 17 in the vertical cross-sectional view. The kerf-region photoresist material portions 77M may be used to measure an overlay error between the photoresist material layer 77 and the underlying material portions by comparing the position of the kerf-region photoresist material portions 77M to the proximal (i.e., closest) alignment mark 17.

In one embodiment, the at least one material portion that is located within each die region 900 over the semiconductor material layer 10 may comprise at least 100 repetitions of a unit layer stack that includes an insulating layer 32 and a spacer material layer (such as sacrificial material layers 42) such that the insulating layers 32 and the spacer material layers form an alternating stack along a vertical direction.

In one embodiment, the at least one material portion has a thickness that is greater than 3 microns, the photoresist material layer 77 has a contoured top surface and has an average thickness that is less than 3 microns. In one embodiment, the photoresist material layer 77 may have a higher reflectivity than the material (such as silicon oxide) of the alignment marks 17. In one embodiment, the ratio of the reflectivity of the photoresist material layer 77 to the reflectivity of the material of the alignment marks 17 may be in a range from 1.5 to 2 at a wavelength in a range from 150 nm to 380 nm, and range from 1.75 to 2.0 at a wavelength in a range from 150 nm to 260 nm.

Generally, the lithographic pattern that is formed within the die-region photoresist material portions 77D is subsequently employed to define the features that are formed within semiconductor devices (such as terrace regions (i.e., staircases) in the alternating stack). Thus, the focal plane of the lithographic exposure process that is employed to pattern the photoresist material layer 77 is at or in proximity to the horizontal plane including the bottom surfaces of the die-region photoresist material portions 77D, which is the same as the horizontal plane including the topmost surfaces of the at least one material portion (such as the alternating stack of insulating layers 32 and sacrificial material layers 42 and the optional insulating layer) within each die region 900.

Accordingly, in case the kerf-region photoresist material portions 77M have tapered sidewalls, the most accurate estimate of the overlay of the die-region photoresist material portions 77D employing the patterns of the kerf-region photoresist material portions 77M can be obtained by measuring the lateral extent of the kerf-region photoresist material portions 77M as close as possible to the horizontal plane including the topmost surfaces of the at least one material portion (such as the alternating stack of insulating layers 32 and sacrificial material layers 42 and through the optional insulating layer 70). If the topmost surfaces of the kerf-region photoresist material portions 77M are formed below the horizontal plane including the topmost surfaces of the at least one material portion, the most accurate estimate of the overlay of the die-region photoresist material portions 77D relative to the array of alignment marks 17 can be obtained by measuring the location of the topmost surface of the kerf-region photoresist material portions 77M relative to the array of alignment marks 17. In other words, the closer the focal plane employed to capture the image of the kerf-region photoresist material portions 77M to the horizontal plane including the topmost surfaces of the at least one material portion, the more accurate the estimate of the overlay error for the die-region photoresist material portions 77D relative to the array of alignment marks 17.

If the horizontal plane including the topmost surfaces of the at least one material portion is located above the topmost surface segments of the kerf-region photoresist material portions 77M, then the quality of the image of the kerf-region photoresist material portions 77M degrades if the focal plane for capturing the image of the kerf-region photoresist material portions 77M is set above the topmost surface segments of the kerf-region photoresist material portions 77M.

Figure 6:
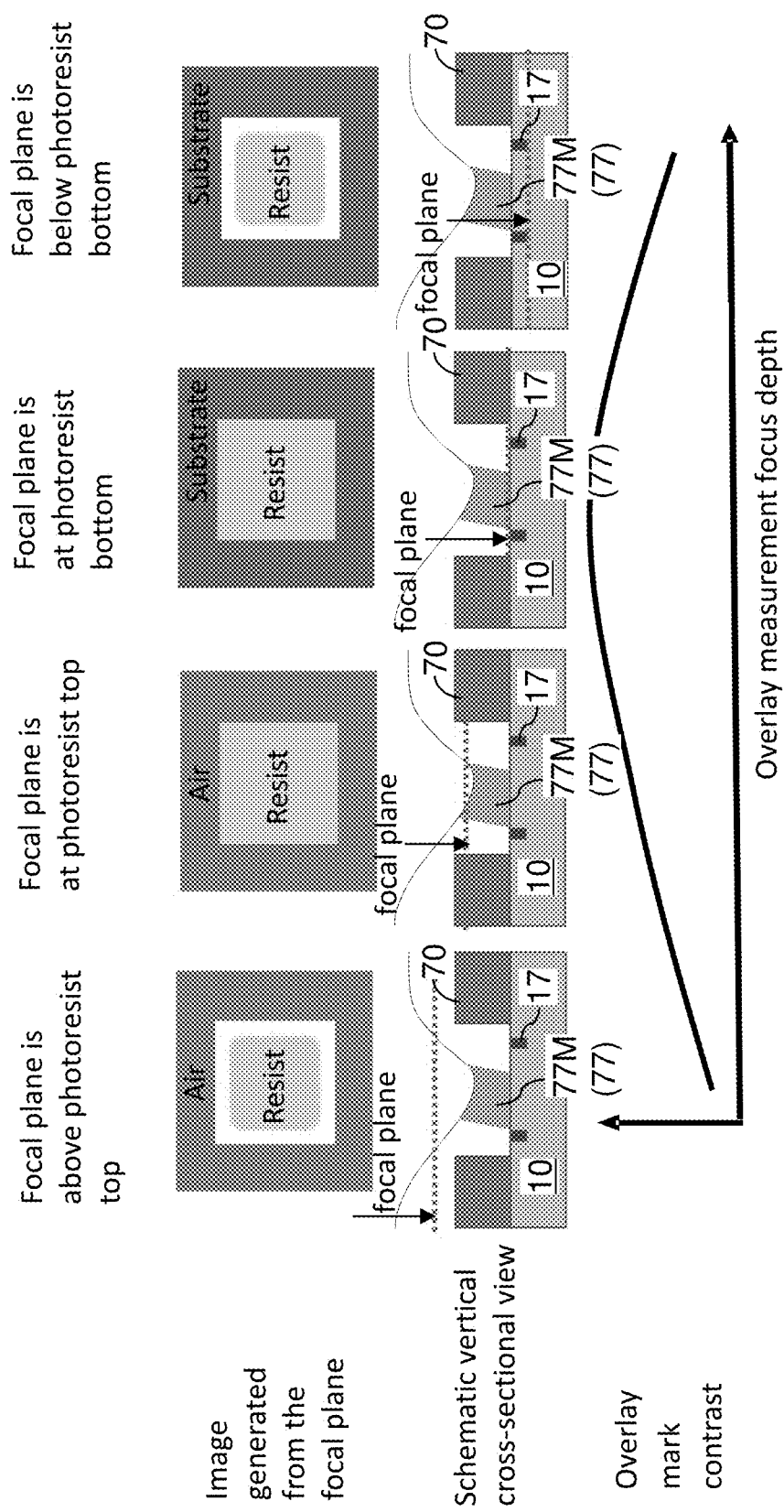
FIG. 6 is a schematic diagram illustrating dependence of photoresist images on an overlay measurement camera as a function of the location of the focal plane.

Referring to FIG. 6, a schematic diagram illustrates the dependence of the image contrast (i.e., sharpness) in photoresist images as captured by an overlay measurement camera as a function of the location of the focal plane, i.e., as a function of the vertical distance of the focal plane from the topmost surface of the semiconductor material layer 10. The overlay measurement focus depth (i.e., the distance between the overlay measurement camera and the focal plane) increases from left to right in FIG. 6. In other words, the vertical distance between the focal plane of the overlay measurement camera and the horizontal plane including the top surface of the semiconductor material layer 10 decreases from left to right from a positive number that is greater than the height of the at least one material portion (such as the alternating stack and layer 70) through zero to a negative number (which corresponds to the case in which the focal plane is located inside the semiconductor material layer 10). Practically, an accurate measurement of the overlay error between a kerf-region photoresist material portion 77M and an underlying (and most proximal) one of the alignment marks 17 requires that the focal plane for the image capture by the overlay measurement camera is located between the topmost segment of the top surface of the kerf-region photoresist material portion 77M and a bottom surface of the kerf-region photoresist material portion 77M to avoid excessive fuzziness in the capture image of the kerf-region photoresist material portion 77M.

According to an aspect of the present disclosure, the image capture process that is employed to determine the overlay of a kerf-region photoresist material portion 77M relative to an underlying alignment mark 17 employs a focal plane that is located at or in proximity to the contoured top surface of the kerf-region photoresist material portion 77M. In one embodiment, the overlay between a kerf-region photoresist material portion 77M and a proximal alignment mark 17 within the array of alignment marks 17 can be measured employing a monochromatic radiation that is focused at a focal plane located at a height that is vertically raised above a horizontal plane including top surfaces of the array of alignment marks 17 by a vertical distance that is in a range from 50% to 100% of a maximum thickness of the kerf-region photoresist material portion 77M. In one embodiment, the overlay between a kerf-region photoresist material portion 77M and a proximal alignment mark 17 within the array of alignment marks 17 can be measured employing a monochromatic radiation that is focused at a focal plane that intersects a contoured top surface of the kerf-region photoresist material portion 77M (e.g., using the second from left focal plane in FIG. 6).

Figure 7A:
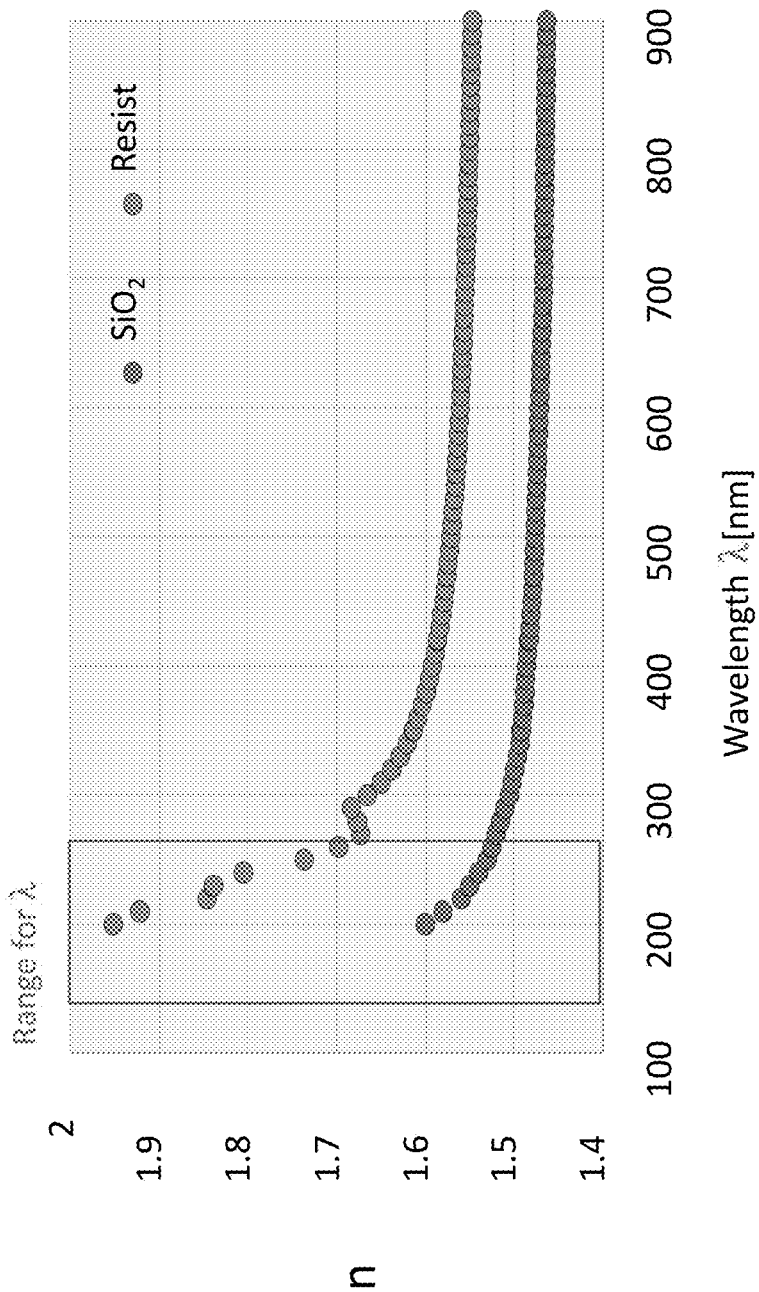
FIG. 7A is a diagram illustrating dependence of the refractive index as a function of the wavelength of measurement beam for silicon oxide and a photoresist material.
Figure 7B:
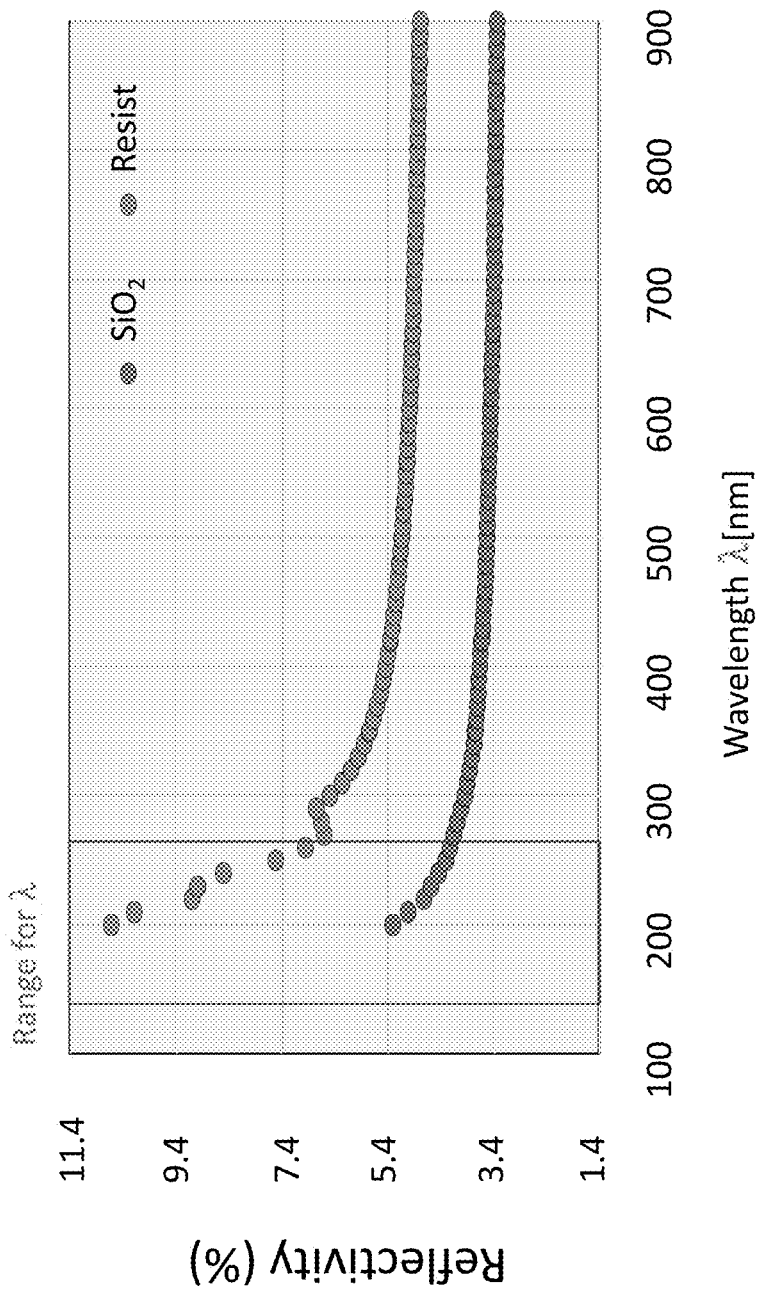
FIG. 7B is a diagram illustrating dependence of the reflectivity as a function of the wavelength of measurement beam for silicon oxide and a photoresist material.

FIG. 7A is a plot illustrating dependence of the refractive index as a function of the wavelength of measurement beam for silicon oxide and a photoresist material that may be the material of the kerf-region photoresist material portions 77M. FIG. 7B is a plot illustrating dependence of the reflectivity as a function of the wavelength of measurement beam for silicon oxide and a photoresist material.

Generally, the sharpness (i.e., the contrast) of the image of the alignment marks 17 decreases with a vertical distance from a geometrical center height of the alignment marks 17, which located at about midway between the top surfaces of the alignment marks 17 and the bottom surfaces of the alignment marks 17. The loss in the sharpness of the image of the alignment marks 17 with an increases in the vertical distance between the focal plane of the overlay measurement camera and the horizontal plane including the top surfaces of the alignment marks 17 may be partially compensated if the reflectivity and the refractive index of the material (e.g., silicon oxide) of the alignment marks 17 and the difference thereof from the reflectivity and the refractive index of the photoresist material increases through use of a short wavelength radiation such as a monochromatic radiation having a wavelength in a range from 150 nm to 380 nm. As used herein, "monochromatic" means a narrow wavelength band radiation having a peak wavelength and a relatively small half maximum peak width of less than 100 nm.

As illustrated in FIGS. 7A and 7B, the refractive index and the reflectivity of the silicon oxide material (which may be employed for the alignment marks 17) and for the photoresist material (which is the material of the kerf-region photoresist material portions 77M) increase with a decrease in the wavelength in the wavelength range between 150 m to 400 nm. Furthermore, the difference in reflectivity between the material of the alignment mark and the material of the photoresist increase in this wavelength range. Thus, the top of the kerf-region photoresist material portion 77M may be imaged more clearly due to this difference. Therefore, the use of an ultraviolet wavelength in a range from 150 nm to 380 nm, such as from 150 nm to 260 nm, for the peak transmission wavelength of the incident radiation can increase the image contrast in the captured images of a kerf-region photoresist material portion 77M and a proximal alignment mark 17. The incident radiation may comprise radiation emitted from an ultraviolet laser or lamp with a peak wavelength in the range between 150 nm and 380 nm, such as between 150 nm and 260 nm. Alternatively, the incident radiation may comprise broad wavelength band radiation emitted from a lamp which is then passed through a monochromatic optical filter having a transmission wavelength window in the 150 nm to 380 nm range, such as the 150 nm to 260 nm range.

Figure 7C:
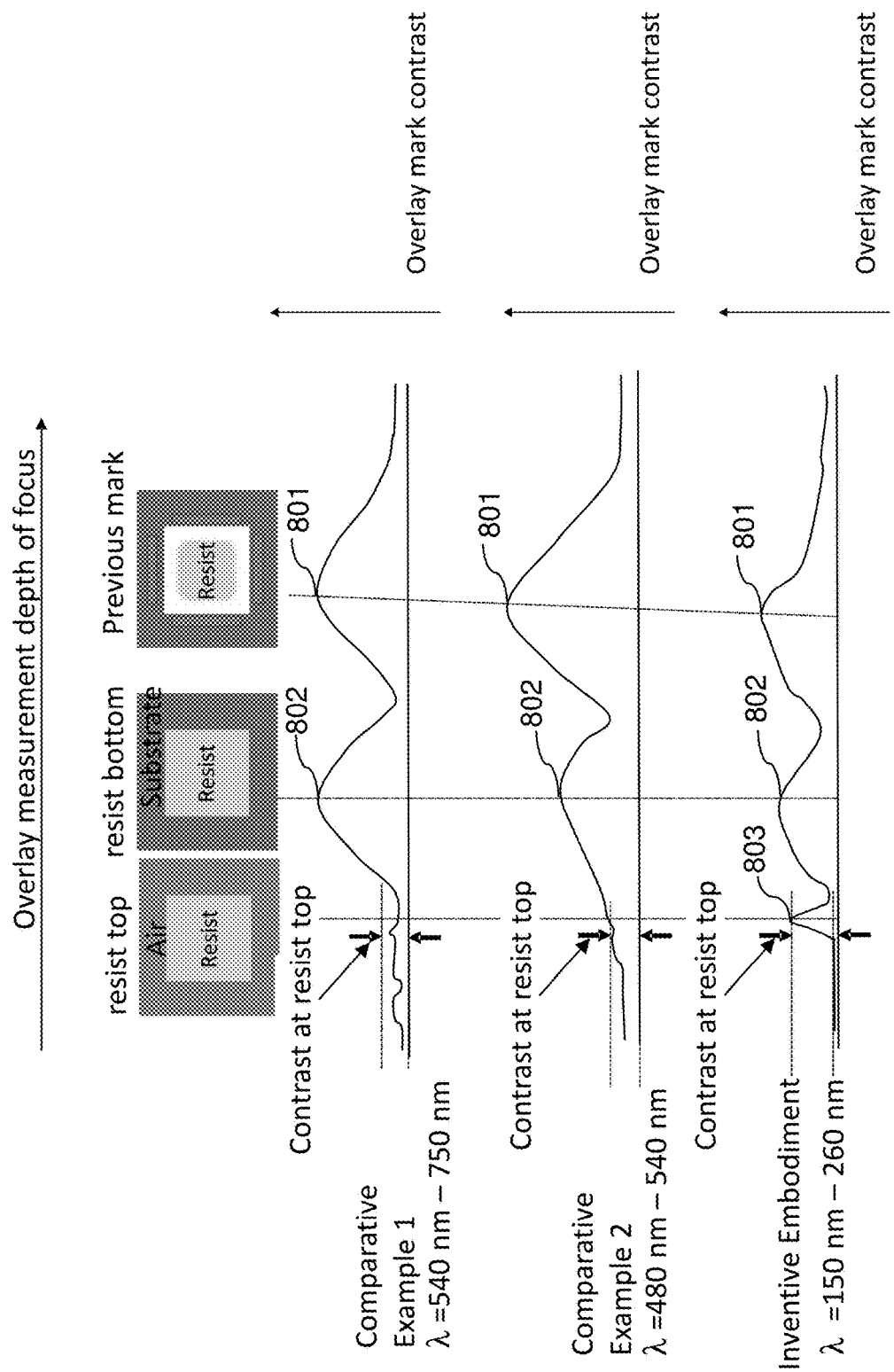
FIG. 7C is a schematic diagram illustrating the image contrast as a function of a depth of focus for selective measurement wavelength ranges according to an embodiment of the present disclosure.

FIG. 7C illustrates the image contrast as a function of a depth of focus for selective measurement wavelength ranges according to an embodiment of the present disclosure. The image contrast measures the sharpness of the overall image as captured by an overlay measurement camera that includes a first image component for a kerf-region photoresist material portion 77M and a second image component for an alignment mark 17. Generally, the plot of image contrast as a function of the depth of focus has two prominent peaks (801, 802). The first prominent peak 801 in the image contrast corresponds to a horizontal plane passing through a center portion of the alignment mark 17 and located underneath the top surface of the semiconductor layer 10. The second prominent peak 801 in the image contrast corresponds to a horizontal plane located at or in proximity to the bottom plane of the kerf-region photoresist material portion 77M (or to the horizontal plane including the top surface of the semiconductor material layer 10). The image contrast does not include a significant peak when the depth of focus is at or in proximity to the top surface of the kerf-region photoresist material portion 77M when the wavelength of the radiation (e.g., visible light) employed to generate an image at the monochromatic overlay measurement camera is in a range from 540 nm to 750 nm, or in a range from 480 nm to 540 nm, as shown in the Comparative Example 1 and Comparative Example 2 plots. However, in the plot of the Inventive Embodiment, the image contrast includes an additional peak 803 when the depth of focus is at or in proximity to the top surface of the kerf-region photoresist material portion 77M when the wavelength of the radiation employed to generate an image at the overlay measurement camera in a range from 150 nm to 260 nm. A wavelength in a range from 260 nm to 380 nm provides a smaller useful peak 803 in the image contrast when the depth of focus is at or in proximity to the top surface of the kerf-region photoresist material portion 77M. This measurement may remove or decrease the influence of the tilt of the kerf-region photoresist material portion 77M from the overlay exposure position error calculation.

After imaging the top surface of the kerf-region photoresist material portion 77M using ultraviolet radiation using peak 803, the position of the previous alignment mark 17 may be determined using separate visible light range incident radiation (having a peak wavelength of 400 nm or greater, such as 480 nm to 540 nm or 540 nm to 750 nm). The use of visible light to determine the position of the alignment mark 17 provides improved prominent peaks 801 and 802. Thus, the overlay error may be determined using dual wavelength incident radiation measurements.

According to an aspect of the present disclosure, the depth of focus for an overlay measurement camera employing a wavelength in a range from 150 nm to 380 nm can be set such that the depth of focus is at or in proximity to the top surface of the kerf-region photoresist material portion 77M. In this case, the image contrast can be sufficient to generate an optical image that provides a more accurate overlay measurement between the area of the contoured top surface of the kerf-region photoresist material portion 77M and a most proximal (underlying) alignment mark 17. Overlay measurement data generated employing this method is a more accurate estimate of the overlay between the die-region photoresist material portions 77D relative to the array of alignment marks 17 than overlay measurement data taken in a conventional manner as generated employing an optical image that provides the highest image contrast (and generated employing a focal plane located at the bottom of a photoresist material portion and incident radiation in the visible light range). In other words, while use of the focal plane in proximity to the top surface of the kerf-region photoresist material portion 77M generally degrades the image contrast, use of a monochromatic radiation having a wavelength in a range from 150 nm to 380 nm can partially compensate for the loss in the image contrast. Thus, use of the ultraviolet monochromatic radiation as an image capture incident radiation provides a measurement of the overlay error between a top surface of the kerf-region photoresist material portion 77M and the underlying alignment mark 17. This provides a better estimate for the overlay error between the die-region photoresist material portions 77D relative to the array of alignment marks 17.

Use of the ultraviolet radiation increases the ratio of the average thickness of the photoresist material layer 77 to the peak wavelength of the radiation. In one embodiment, average thickness of the photoresist material layer 77 may be greater than 2 times the peak wavelength of the monochromatic radiation, and/or may be greater than 3 times the peak wavelength of the monochromatic radiation, and/or may be greater than 4 times the peak wavelength of the monochromatic radiation, and/or may be greater than 5 times the peak wavelength of the monochromatic radiation, and/or may be greater than 10 times the peak wavelength of the monochromatic radiation.

In one embodiment, one, a plurality and/or each of kerf-region photoresist material portions 77M may have a contoured top surface with a height variation that is at least 5%, and/or at least 10%, and/or at least 15%, and/or at least 20%, of an average height of the contoured top surface.

In one embodiment, the minimum height of the contoured top surface of one, a plurality and/or each of the kerf-region photoresist material portions 77M may be greater than 2 times the peak wavelength of the monochromatic radiation, and/or may be greater than 3 times the peak wavelength of the monochromatic radiation, and/or may be greater than 4 times the peak wavelength of the monochromatic radiation, and/or may be greater than 5 times the peak wavelength of the monochromatic radiation, and/or may be greater than 10 times the peak wavelength of the monochromatic radiation.

Figure 8:
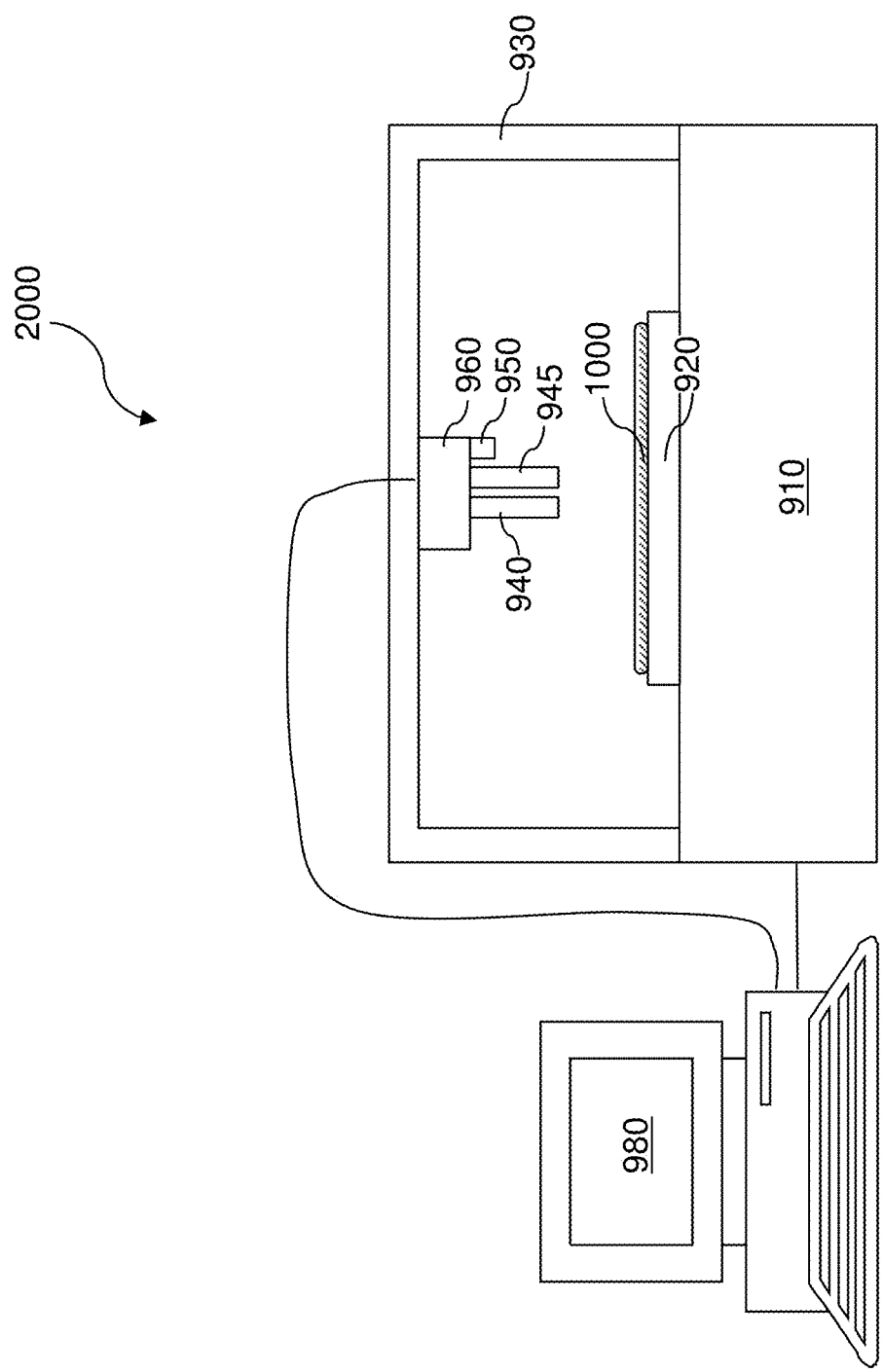
FIG. 8 is a schematic diagram of an overlay measurement apparatus according to an embodiment of the present disclosure.

Referring to FIG. 8, an overlay measurement apparatus 2000 according to an embodiment of the present disclosure is illustrated, which may be employed to perform the above-described overlay measurement process of the embodiment of the present disclosure. The overlay measurement apparatus 2000 comprises a chuck 920 configured to mount the semiconductor wafer 1000 thereupon, an ultraviolet radiation source 940 (e.g., an ultraviolet lamp, light emitting diode or laser) configured to emit ultraviolet radiation having a peak wavelength of 380 nm or less, a visible light source 945 (e.g., a visible light emitting lamp, light emitting diode or laser) configured to emit visible light having a peak wavelength of 400 nm or more, a camera 950 configured to sequentially generate images of an area with changes in a location of a focal plane along a vertical direction that is perpendicular to a top surface of the chuck 920 and a controller 980. The controller 980 is configured to analyze the images generated by the camera 950 based on the ultraviolet radiation reflected from the semiconductor wafer 1000; and measure an overlay offset of an image of the top surface of a photoresist material portion 77M relative to an alignment mark 17 located within the semiconductor wafer 1000 in proximity to the photoresist material portion 77M.

In one embodiment, the controller is further configured to determine a height of a target focus horizontal plane at which a top surface of the photoresist material portion 77M is located, and change the focal plane of the camera 950 to the target focus horizontal plane. In one embodiment, the controller 980 is further configured to select the target focus horizontal plane at a location that has a vertical distance from a top surface of the semiconductor wafer that 1000 is in a range from 50% to 100% of a maximum height of the photoresist material portion 77M.

In one embodiment, the controller 980 is further configured to determine a position of a previous alignment mark based on reflection of the visible light emitted by the visible light source 945 and reflected from the semiconductor wafer 1000. In one embodiment, the ultraviolet radiation source 940 is configured to emit ultraviolet radiation which has a peak wavelength in a range from 150 nm to 260 nm.

The controller 980 may comprise any suitable general or special purpose computer or logic chip. For example, the controller may comprise a computer that is configured to execute an image analysis program that analyzes the images generated by the camera 950 and determines the height of the target focus horizontal plane at which a top surface of a photoresist material portion 77M is located. The controller 980 may also execute an image capture program that changes the focal plane of the camera 950 to the target focus horizontal plane. The controller 980 may also execute the overlay measurement program that measures the overlay offset.

The overlay measurement apparatus 2000 may comprise an apparatus platform 910 on which the chuck 920 is mounted. The apparatus platform 920 may comprise actuation motors configured to drive the chuck 920 along horizontal directions and along the vertical direction. The overlay measurement apparatus 2000 may comprise an apparatus frame 930 to which is an optical module head 960 is attached. The radiation sources (940, 945) and/or the camera 950 may be attached to the optical module head 960. The optical module head 960 may be in data communication with the controller via a wired or wireless data connection.

Figure 9:
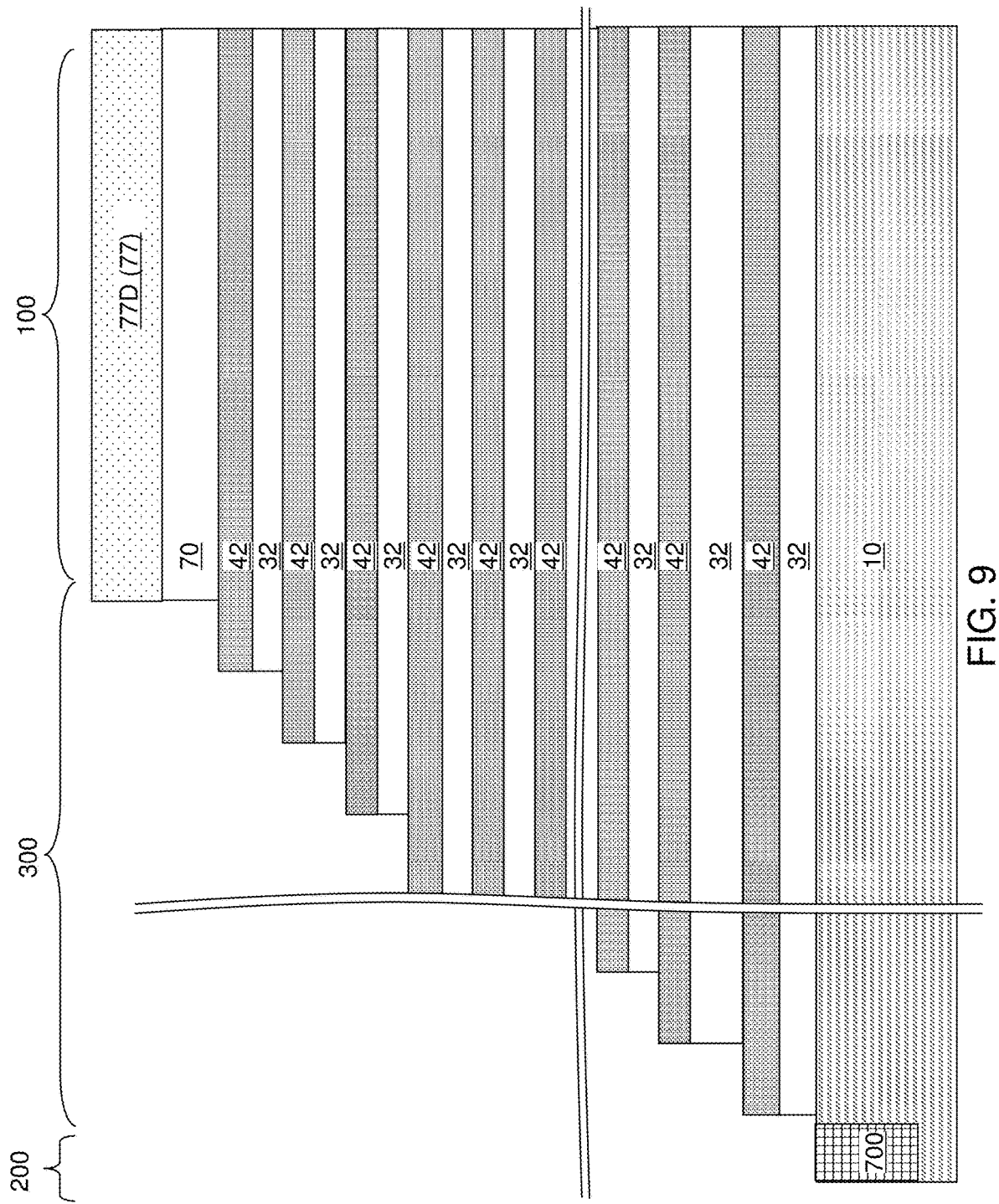
FIG. 9 is a schematic vertical cross-sectional view of an exemplary structure located within a die region after formation of stepped surfaces according to an embodiment of the present disclosure.

Referring to FIG. 9, the die-region photoresist material portions 77D of the patterned photoresist material layer 77 are used as a mask to form the stepped surfaces in the alternating stack (32, 42) in the contact region 300. The portion of the contact region 300 containing the stepped surfaces is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, a photolithography and etch process of a first type that vertically increases the depth of a cavity by one or more levels, and a photoresist trimming and etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

Generally, an alternating stack of insulating layers 32 and spacer material layers can be formed over a semiconductor material layer 10. The spacer material layers are formed as, or are subsequently replaced with, electrically conductive layers. In case the spacer material layers are subsequently replaced with the electrically conductive layers, the spacer material layers may comprise sacrificial material layers 42. The alternating stack (32, 42) can be patterned such that the alternating stack (32, 42) comprises a memory array region 100 in which each layer within the alternating stack (32, 42) is present and a staircase region 300 in which lateral extents of the spacer material layers (such as sacrificial material layers 42) decrease as a function of a vertical distance from the semiconductor material layer 10.

Figure 10A:
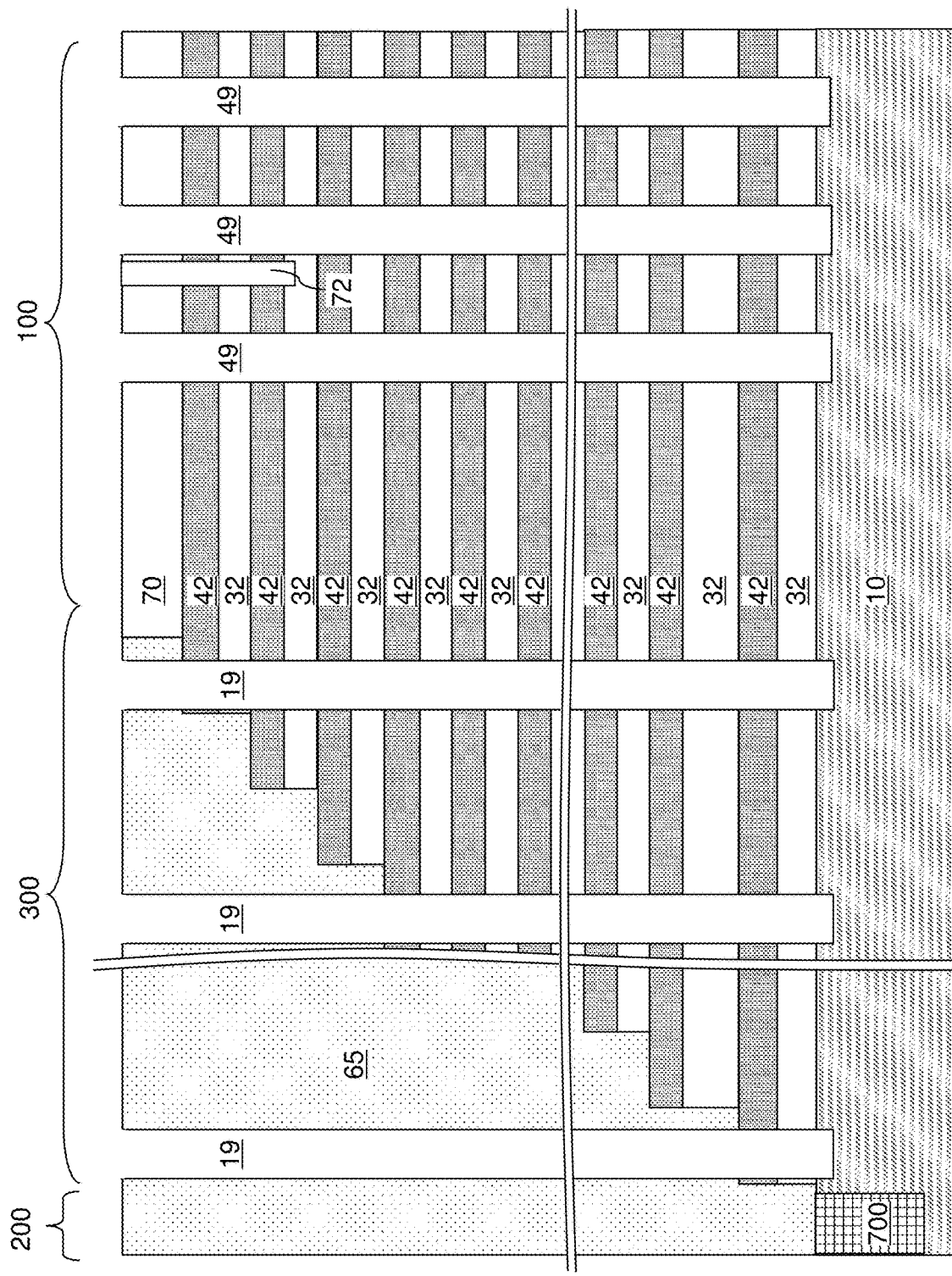
FIG. 10A is a schematic vertical cross-sectional view of the exemplary structure after formation of memory openings and support openings according to an embodiment of the present disclosure.
Figure 10B:
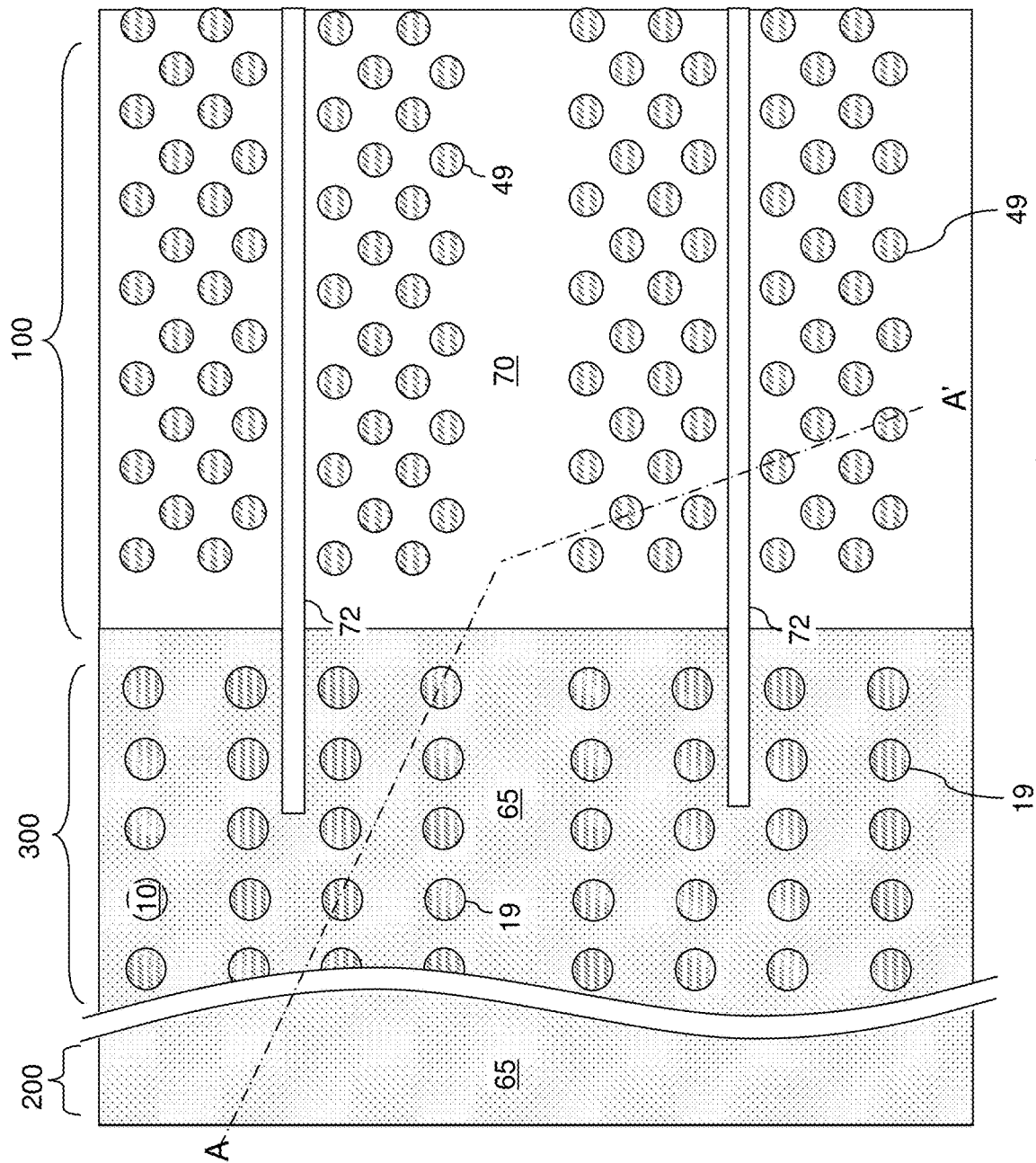
FIG. 10B is horizontal cross-sectional view along horizontal plane B-B' of the exemplary structure of FIG. 10A. The vertical plane A-A' is the plane of the cross-section for FIG. 10A.

Referring to FIGS. 10A and 10B, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

An anisotropic etch process can be performed to form memory openings 49 and support openings 19 through the insulating cap layer 70, the alternating stack (32, 42), and the retro-stepped dielectric material portion 65. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed.

The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

Figure 11:
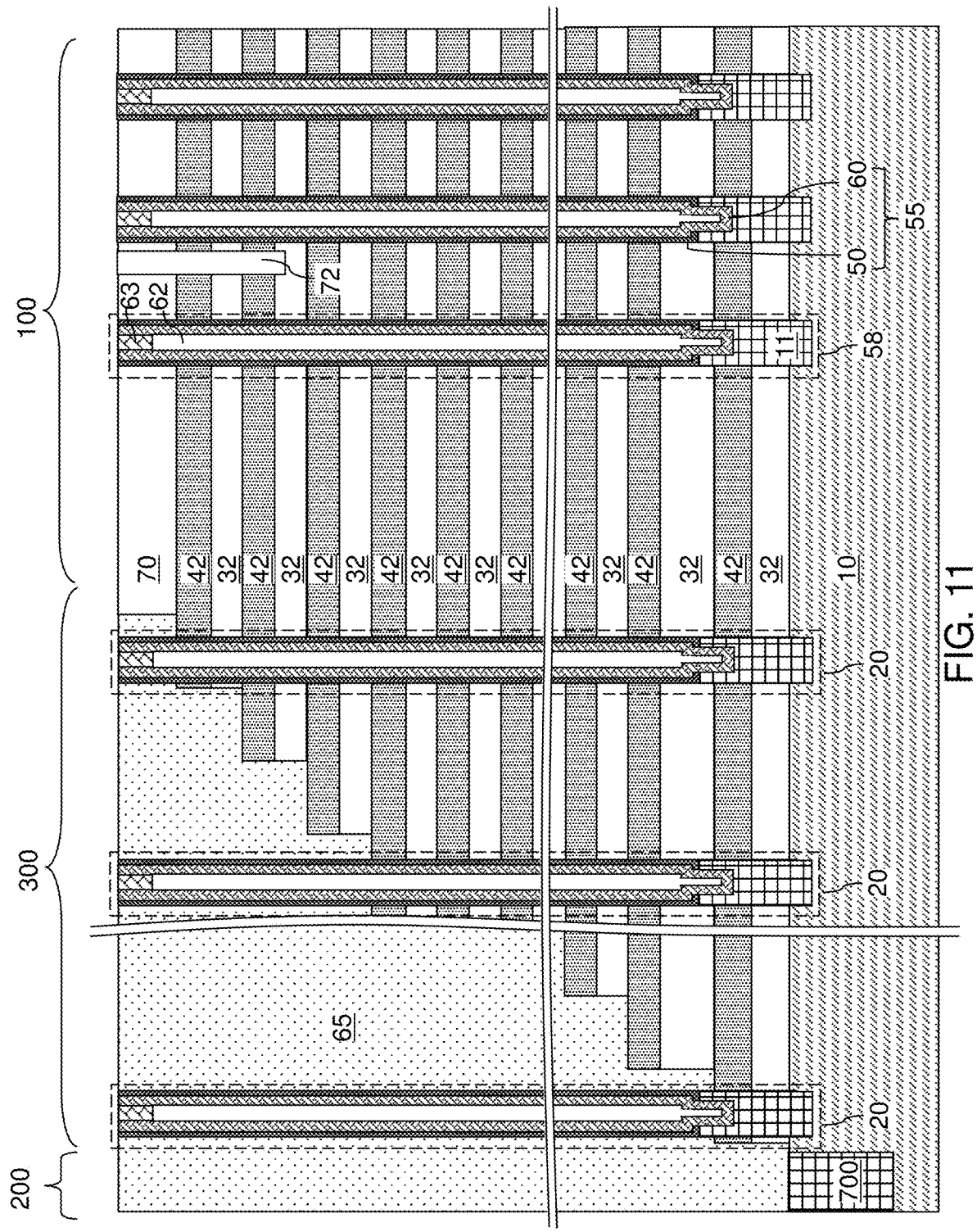
FIG. 11 is a schematic vertical cross-sectional view of the exemplary structure after formation of memory stack structures and support pillar structures according to an embodiment of the present disclosure.

Referring to FIG. 11, memory opening fill structures 58 can be formed in the memory openings 49, and support pillar structures 20 can be formed in the support openings 19. Each of the memory opening fill structures 58 and the support pillar structures 20 may comprise an optional semiconductor pedestal channel 11, a memory film 50, a vertical semiconductor channel 60, an optional dielectric core 62, and a drain region 63. Each contiguous combination of a memory film 50 and a vertical semiconductor channel 60 constitutes a memory stack structure 55. In one embodiment, the semiconductor material layer 10, the semiconductor pedestal channels 11, and the vertical semiconductor channels 60 may have a doping of a first conductivity type, and the drain regions 63 may have a doping of a second conductivity type that is the opposite of the first conductivity type. Each memory opening fill structure 58 may be employed to provide a vertical NAND string, while the support pillar structures 20 may be electrically inactive, and may be employed as dummy structures that provide structural support during subsequent replacement of the sacrificial material layers 42 with electrically conductive layers.

Figure 12A:
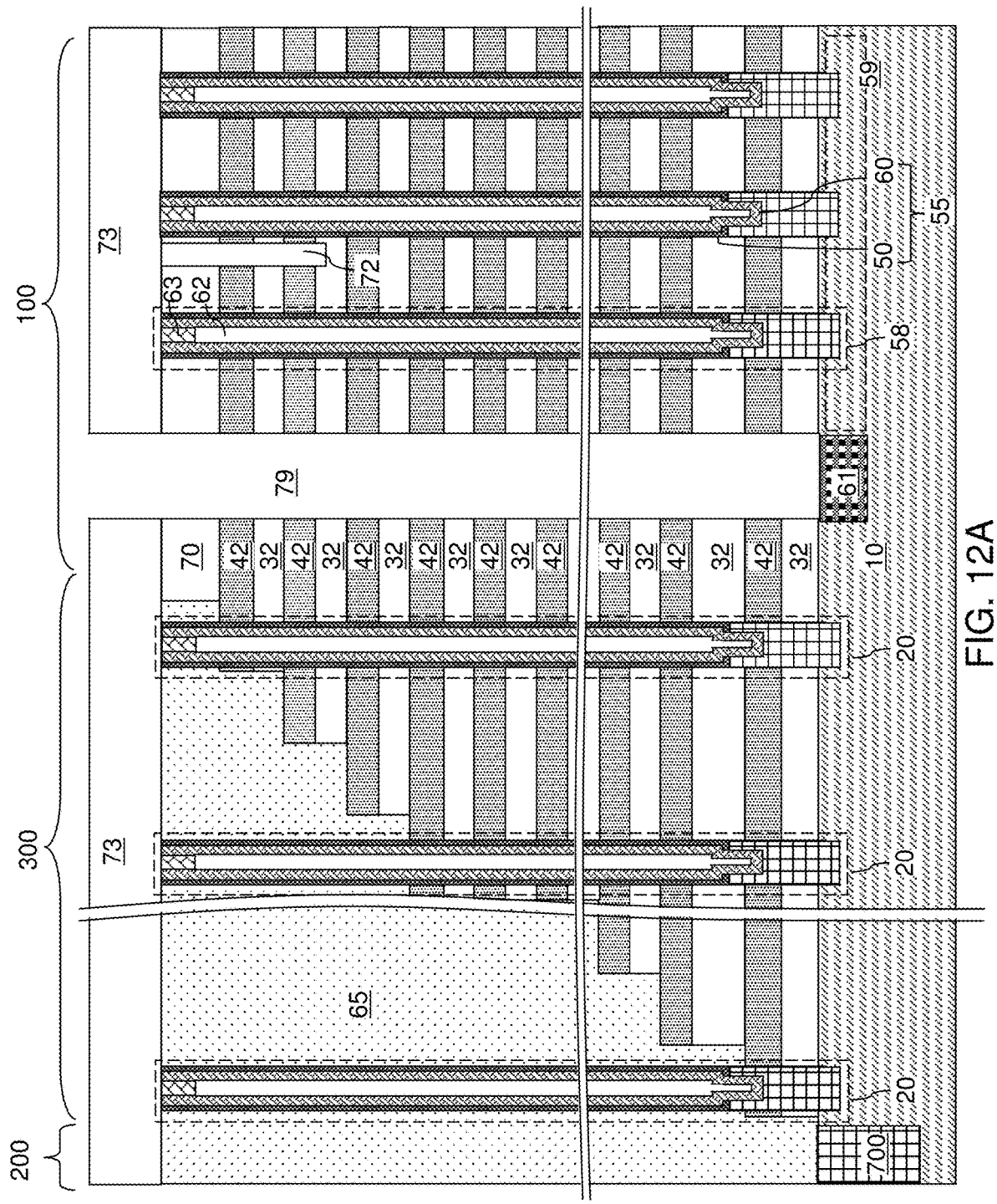
FIG. 12A is a schematic vertical cross-sectional view of the exemplary structure after formation of backside trenches according to an embodiment of the present disclosure.
Figure 12B:
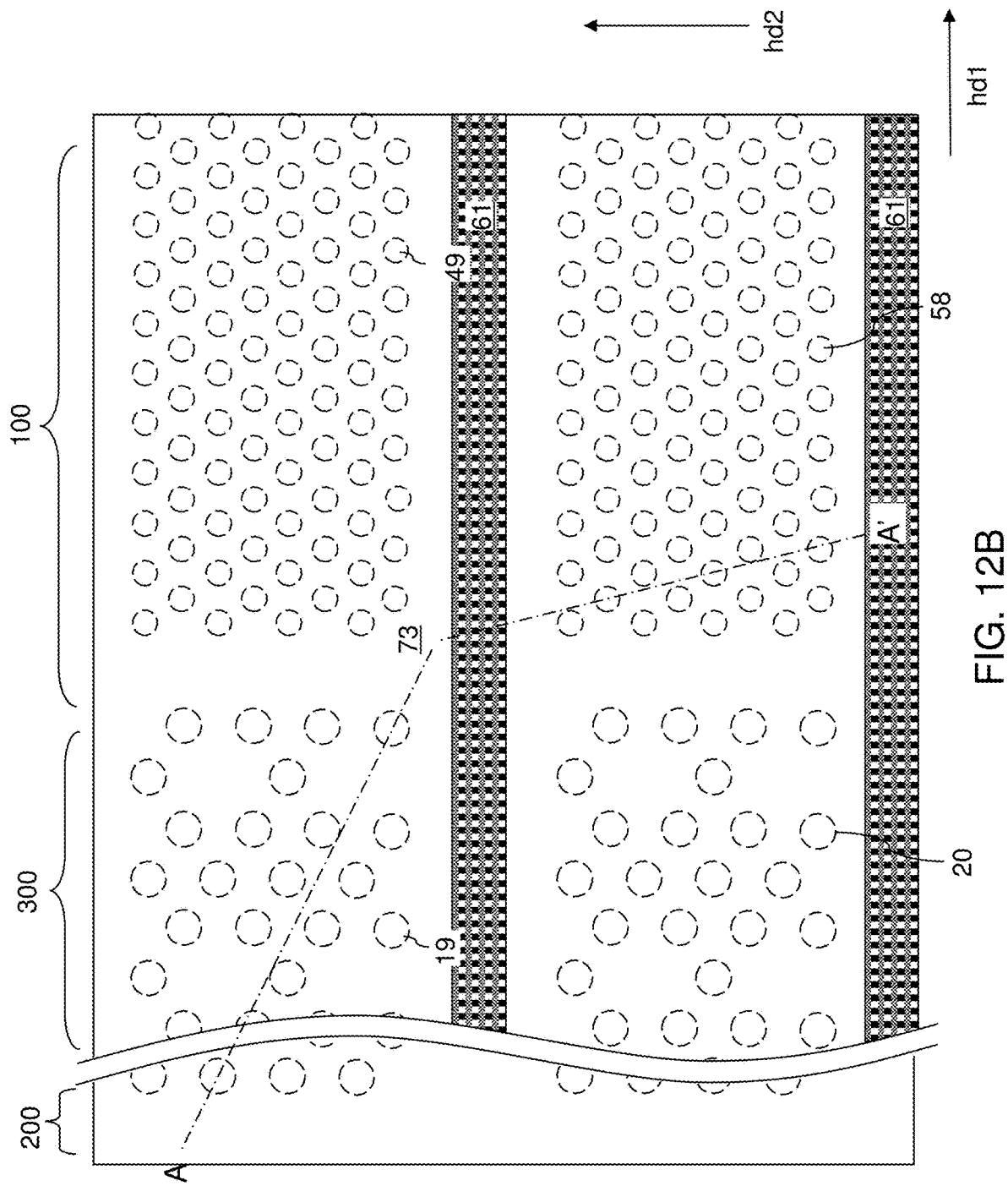
FIG. 12B is a partial see-through top-down view of the exemplary structure of FIG. 12A. The vertical plane A-A' is the plane of the schematic vertical cross-sectional view of FIG. 12A.

Referring to FIGS. 12A and 12B, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the semiconductor material layer 10, and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 13:
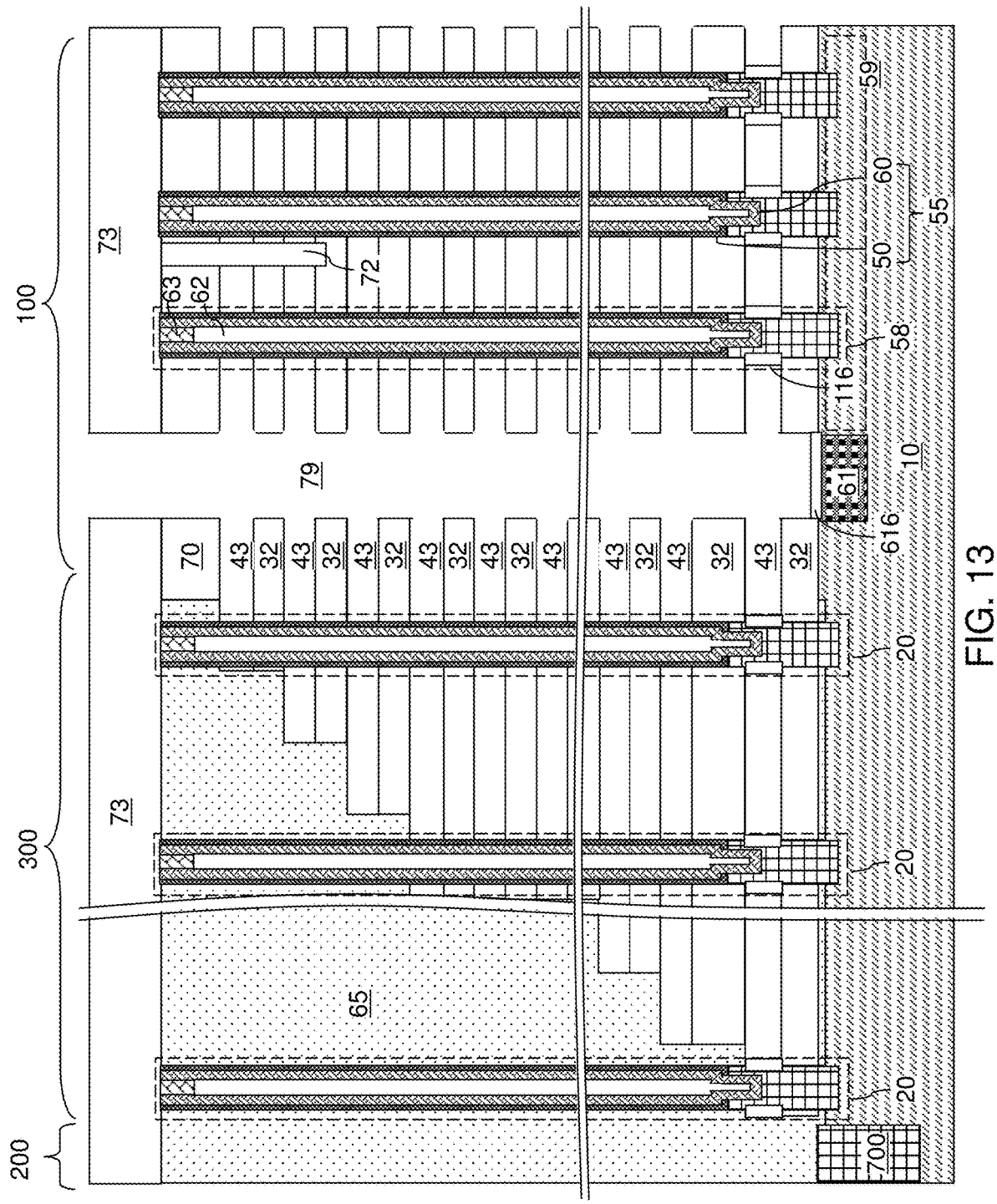
FIG. 13 is a schematic vertical cross-sectional view of the exemplary structure after formation of backside recesses according to an embodiment of the present disclosure.

Referring to FIG. 13, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the semiconductor material layer 10. In this case, each backside recess 43 can define a space for receiving a respective word line of the array of monolithic three-dimensional NAND strings.

Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 14A:
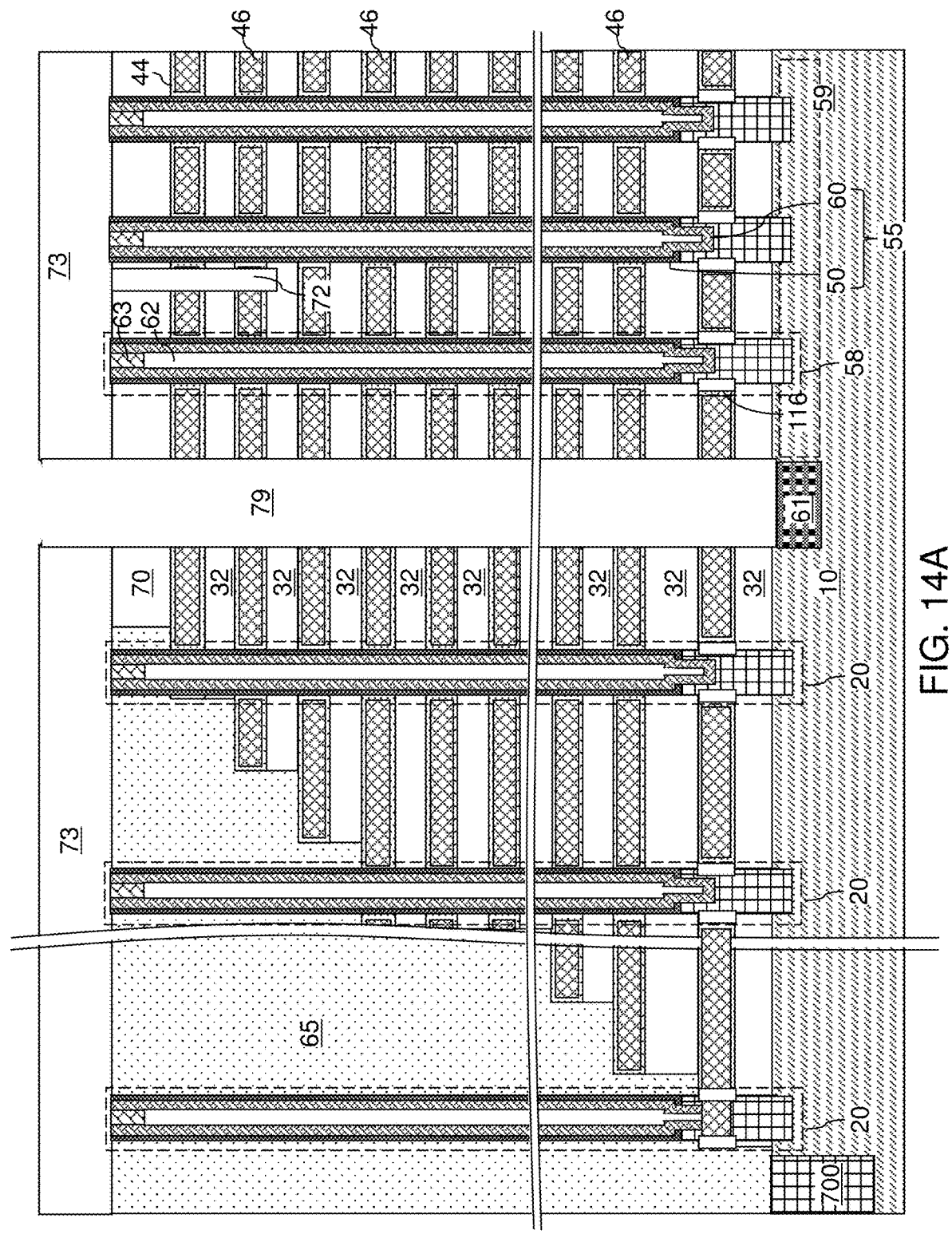
FIG. 14A is a schematic vertical cross-sectional view of the exemplary structure during formation of electrically conductive layers according to an embodiment of the present disclosure.
Figure 14B:
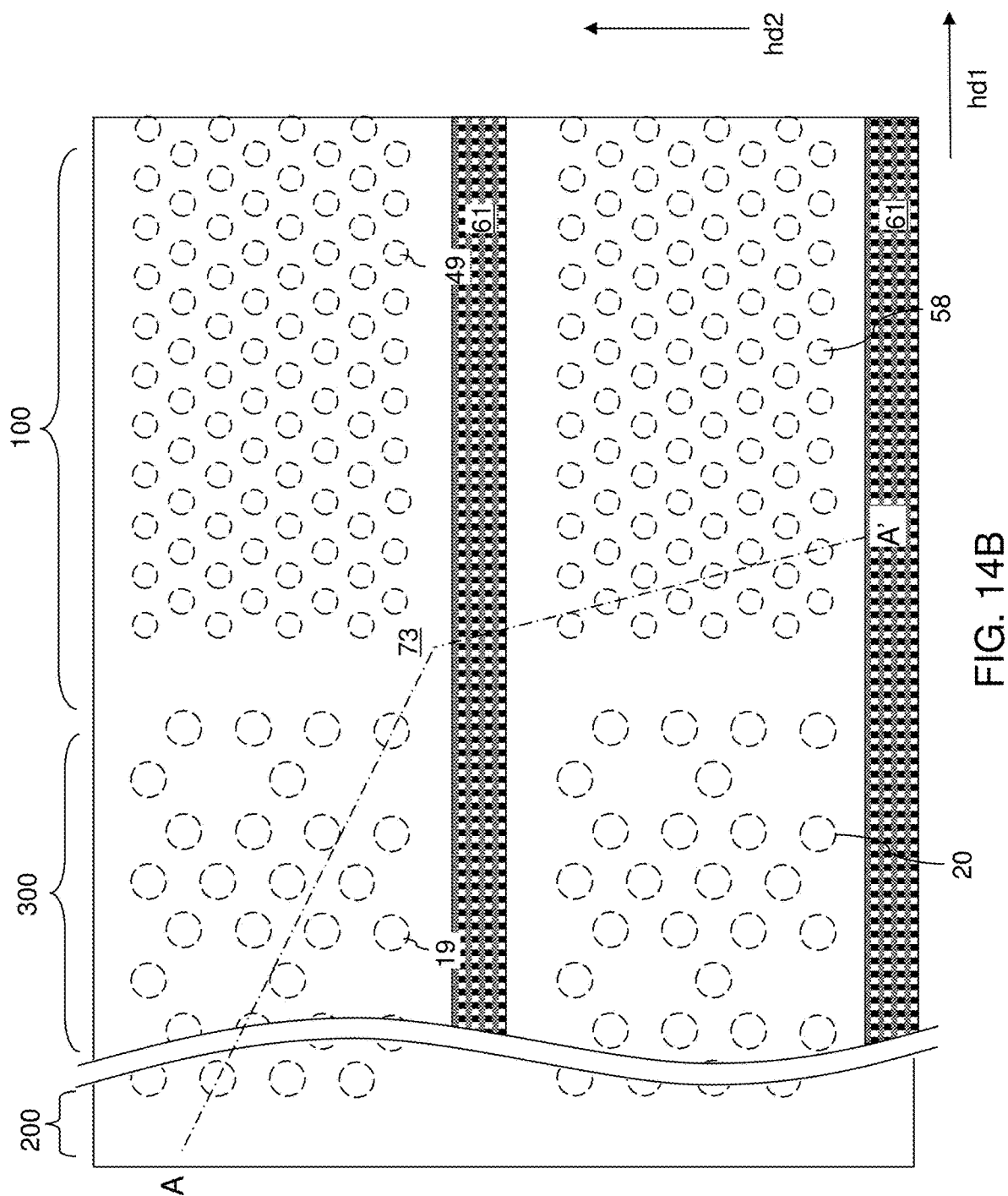
FIG. 14B is a top-down view of the exemplary structure of FIG. 14A. The vertical plane A-A' is the plane of the schematic vertical cross-sectional view of FIG. 14A

Referring to FIGS. 14A and 14B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity is present within the portion of each backside trench 79 that is not filled with the backside blocking dielectric layer 44.

At least one metallic material can be deposited in the backside recesses 43. For example, the at least one metallic material may comprise a metallic barrier layer and a metal fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be subsequently deposited in the plurality of backside recesses 43, on the sidewalls of the at least one the backside trench 79, and over the top surface of the contact-level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer (not shown) can be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact-level dielectric layer 73.

Each sacrificial material layer 42 can be replaced with an electrically conductive layer 46. A backside cavity is present in the portion of each backside trench 79 that is not filled with the backside blocking dielectric layer 44 and the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. The planar dielectric portions 616 can be removed during removal of the continuous electrically conductive material layer. A backside cavity is present within each backside trench 79.

At least one bottommost electrically conductive layer 46 provided upon formation of the electrically conductive layers 46 within the alternating stack (32, 46) can comprise a source side select gate electrode for the vertical NAND strings. At least one topmost electrically conductive layer 46 provided upon formation of the electrically conductive layers 46 within the alternating stack (32, 46) can comprise a drain side select gate electrode for the vertical NAND string. Each optional source region 61 is formed in an upper portion of the semiconductor material layer 10. Semiconductor channels (59, 11, 60) extend between each source region 61 and a respective set of drain regions 63. The semiconductor channels (59, 11, 60) include the vertical semiconductor channels 60 of the memory stack structures 55.

Figure 15:
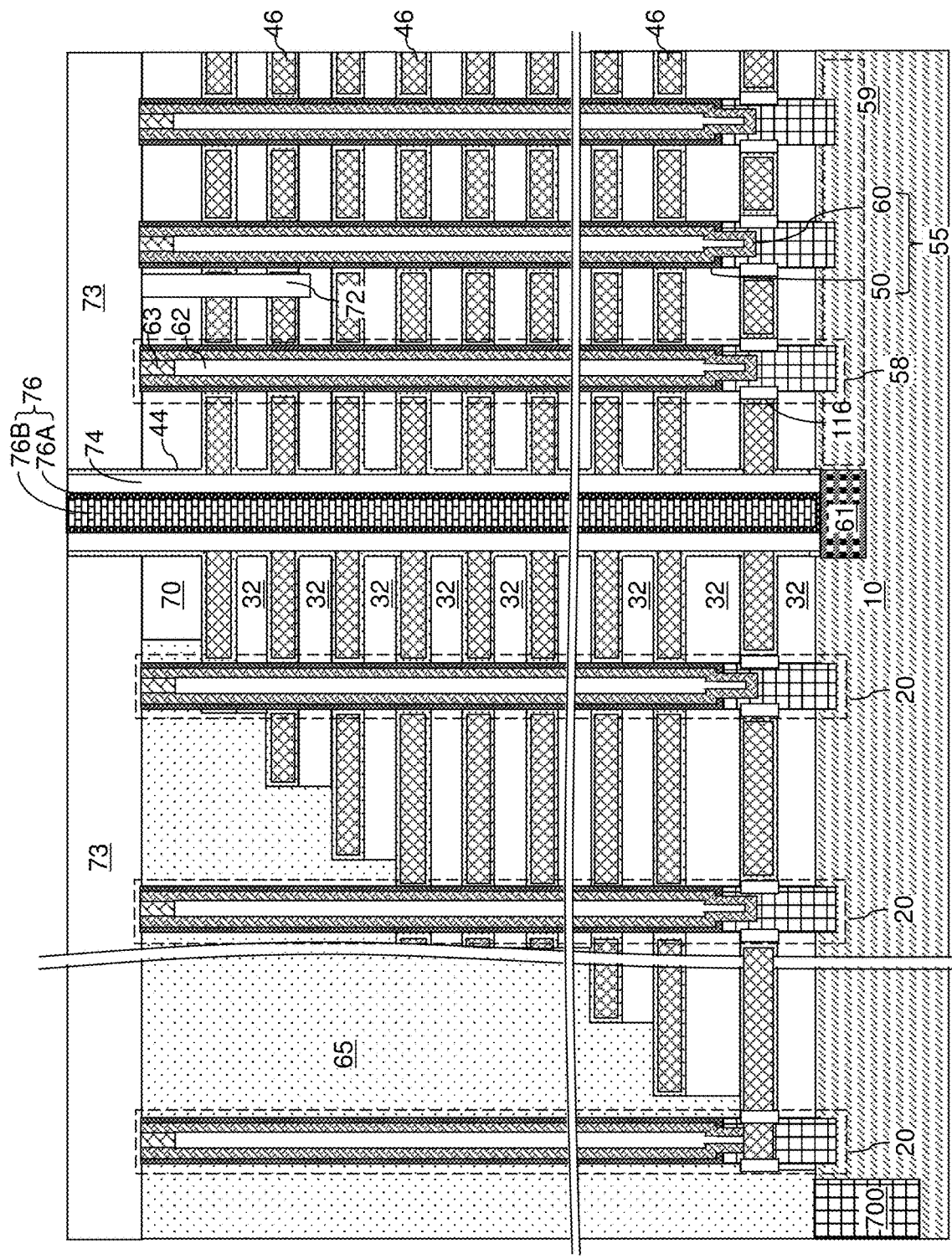
FIG. 15 is a schematic vertical cross-sectional view of the exemplary structure after formation of an insulating spacer and a backside contact structure according to an embodiment of the present disclosure.

Referring to FIG. 15, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 (of the source region 61 if present) can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is included, then the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 16A:
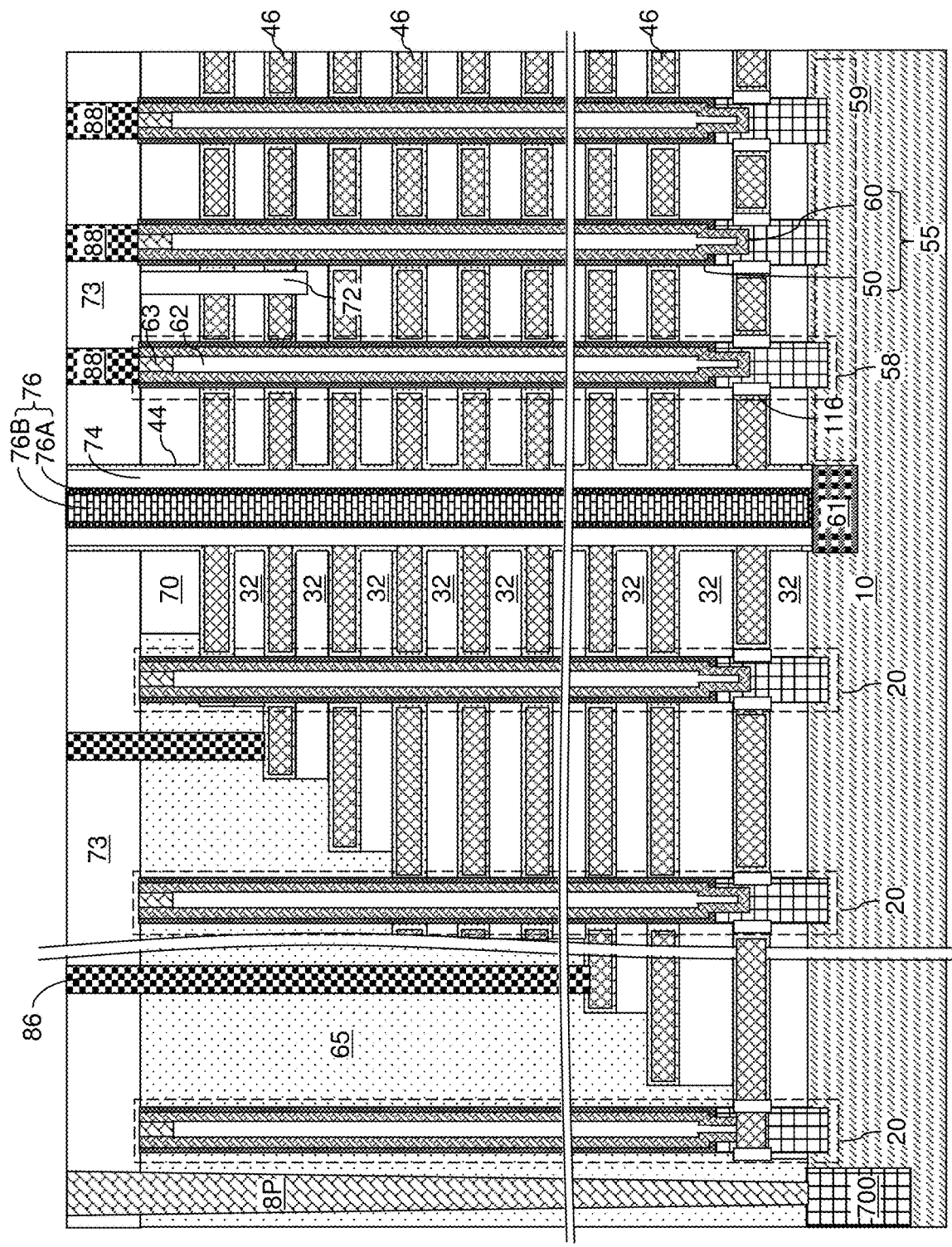
FIG. 16A is a schematic vertical cross-sectional view of the exemplary structure after formation of additional contact via structures according to an embodiment of the present disclosure.
Figure 16B:
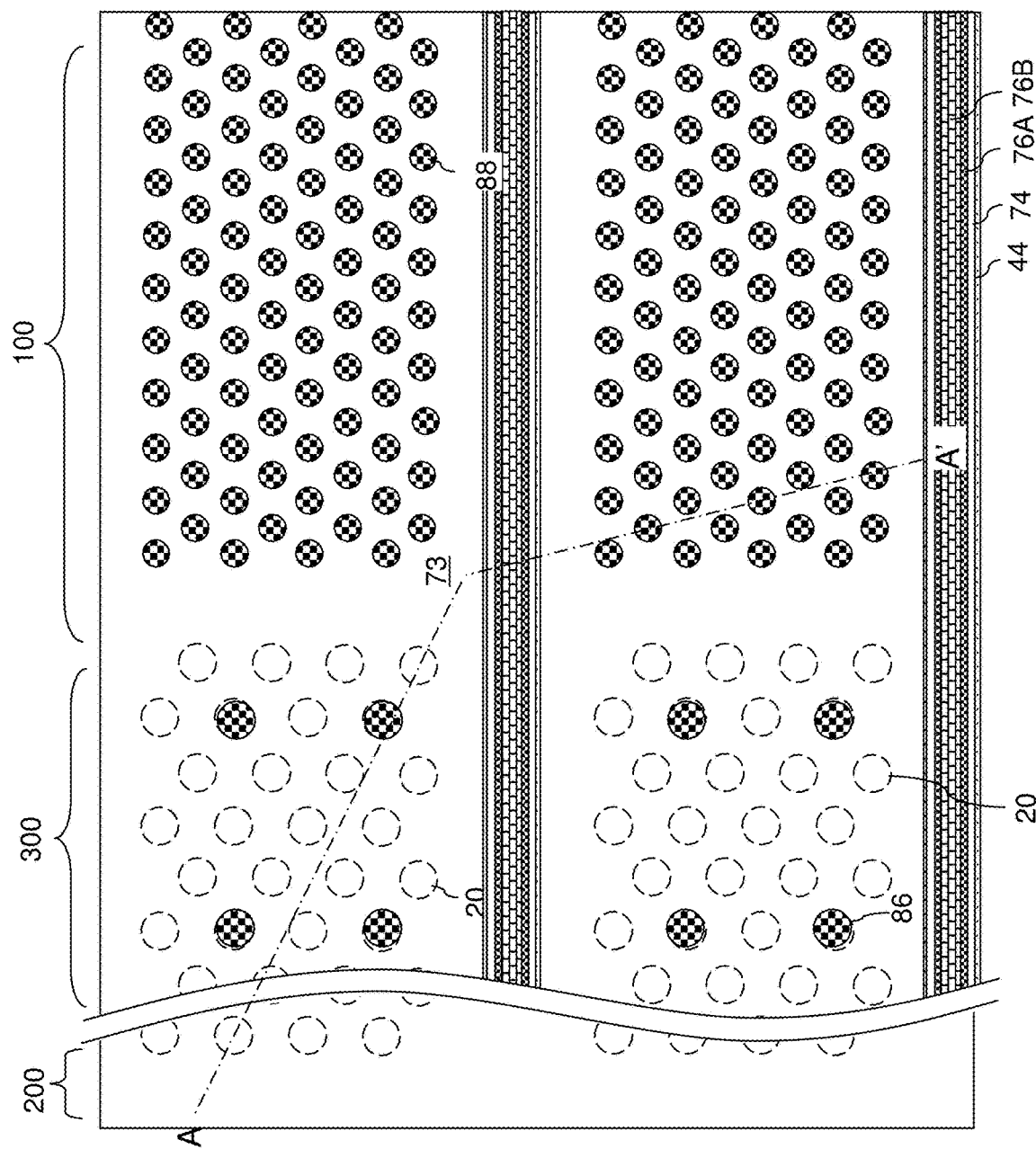
FIG. 16B is a top-down view of the exemplary structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. The word line contact via structures 86 do not contact the support pillar structures 20 due to the break in periodicity (i.e., continuity) in the array of the support pillar structures 20 at locations of the word line contact via structures 86.

While an embodiment is described above employing a specific semiconductor structure including a three-dimensional memory array, the various embodiments of the present disclosure may be employed in any semiconductor manufacturing process in which an alignment mark 17 is formed within a gap between two material portions having a height that is comparable to, or is greater than, the average thickness of a photoresist material portion and/or in which a photoresist material portion is formed with slanted sidewalls. By measuring the location of a top surface of a photoresist material portion instead of a bottom surface of a photoresist material portion, a more accurate estimate of the overlay error between the photolithographic pattern formed over material portions having a greater height than, or having a height that is comparable to, the average thickness of a photoresist material portion can be obtained. The reduction in the image contrast due to the shift of the image focal plane away from an alignment mark can be partially compensated by employing a monochromatic radiation having an ultraviolet peak wavelength generate an optical image having sufficient image contrast for overlay measurement.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise.

Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method, comprising:
forming an alignment mark in a kerf region;
forming at least one material portion over the alignment mark;
patterning the at least one material portion to expose the alignment mark located in the kerf region;
forming a photoresist material layer over the patterned portions of the at least one material portion located in die regions and over the alignment mark located in the kerf region;
lithographically patterning the photoresist material layer into die-region photoresist material portions that are formed within die regions and kerf-region photoresist material portion that is formed within the kerf region; and
measuring an overlay between the kerf-region photoresist material portion and the alignment mark using radiation having a peak wavelength that is less than 380 nm and that is focused at a focal plane located a height that is vertically raised above a horizontal plane including a top surface of the alignment mark by a vertical distance that is in a range from 50% to 100% of a maximum thickness the kerf-region photoresist material portion.

2. The method of claim 1, wherein the radiation has a wavelength in a range from 150 nm to 260 nm.

3. The method of claim 1, further comprising determining a position of a previous alignment mark using visible light radiation having a peak wavelength of 400 nm or greater.

4. The method of claim 1, wherein an average thickness of the photoresist material layer is less than a total height of the at least one material portion.

5. The method of claim 1, wherein a portion of the photoresist material layer located within the kerf region has a top surface segment that is located below a horizontal plane including a topmost horizontal surface of the at least one material portion.

6. The method of claim 1, wherein an average thickness of the photoresist material layer is greater than 2 times the peak wavelength of the radiation.

7. The method of claim 1, wherein the one of the kerf-region photoresist material portion has a contoured top surface with a height variation that is at least 5% of an average height of the contoured top surface.

8. The method of claim 7, wherein a minimum height of the contoured top surface is greater than 2 times the peak wavelength of the radiation.

9. The method of claim 7, wherein a minimum height of the contoured top surface is greater than 10 times the peak wavelength of the radiation.

10. The method of claim 1, wherein the vertical distance is at least 5 times the peak wavelength of the radiation.

11. The method of claim 1, wherein:
the kerf-region photoresist material portion is formed with a first tapered sidewall and a second tapered sidewall having a same tilt direction in a vertical cross-sectional view;
a first angle between a horizonal plane including a top surface the alignment mark and the first tapered sidewall is an obtuse angle; and
a second angle between the horizontal plane and the second tapered sidewall is an acute angle.

12. The method of claim 11, wherein:
the alignment mark comprises two portions that are laterally spaced apart in a vertical cross-sectional view; and
an entirety of the kerf-region photoresist material portion is formed between the two portions of the proximal alignment mark in the vertical cross-sectional view.

13. The method of claim 1, wherein the at least one material portion comprises at least 100 repetitions of a unit layer stack that includes an insulating layer and a spacer material layer such that the insulating layers and the spacer material layers form an alternating stack along a vertical direction.

14. The method of claim 13, further comprising:
etching the alternating stack to form a staircase region in the alternating stack using the die-region photoresist material portions as a mask;
forming memory openings through the alternating stack; and
forming a memory opening fill structures in the memory openings, wherein each memory fill opening structure comprises a memory film and a vertical semiconductor channel.

15. The method of claim 1, wherein:
the at least one material portion has a thickness that is greater than 3 microns;
the photoresist material layer has a contoured top surface and has an average thickness that is less than 3 microns; and
a ratio of a reflectivity of the photoresist material layer to a reflectivity of a material of the proximal alignment mark is in a range from 1.5 to 2 at the peak wavelength of the radiation.

16. An overlay measurement apparatus, comprising:
a chuck configured to mount a semiconductor wafer thereupon;
an ultraviolet radiation source configured to emit ultraviolet radiation having a peak wavelength of 380 nm or less;
a visible light source configured to emit visible light;
a camera configured to sequentially generate images of an area with changes in a location of a focal plane along a vertical direction that is perpendicular to a top surface of the chuck; and
a controller configured to:
analyze the images generated by the camera based on the ultraviolet radiation reflected from the semiconductor wafer;
measure an overlay offset of an image of the top surface of a photoresist material portion relative to an alignment mark located within the semiconductor wafer in proximity to the photoresist material portion;
select the target focus horizontal plane at a location that has a vertical distance from a top surface of the semiconductor wafer that is in a range from 50% to 100% of a maximum height of the photoresist material portion; and
determine a position of a previous alignment mark based on reflection of the visible light emitted from the visible light source and reflected from the semiconductor wafer.

17. The overlay measurement apparatus of claim 16, wherein the controller is further configured to:
- determine a height of a target focus horizontal plane at which a top surface of the photoresist material portion is located; and
- change the focal plane of the camera to the target focus horizontal plane.

18. The overlay measurement apparatus of claim 16, wherein the ultraviolet radiation has a peak wavelength in a range from 150 nm to 260 nm.

* * * * *